United States Patent
Lee et al.

(10) Patent No.: US 10,312,446 B2
(45) Date of Patent: Jun. 4, 2019

(54) CONDUCTIVE POLYMERS, THE ORGANIC PHOTOVOLTAIC CELL COMPRISING THE SAME, AND THE SYNTHESIS THEREOF

(71) Applicant: DAEGU GYEONGBUK INSTITUTE OF SCIENCE AND TECHNOLOGY, Daegu (KR)

(72) Inventors: Youn Gu Lee, Daegu (KR); Hong Gi Kim, Gyeongsangnam-do (KR)

(73) Assignee: Daegu Gyeongbuk Institute of Science and Technology (KR)

(*) Notice: Subject to any disclaimer, the term of this patent is extended or adjusted under 35 U.S.C. 154(b) by 0 days.

(21) Appl. No.: 15/637,023

(22) Filed: Jun. 29, 2017

(65) Prior Publication Data

US 2018/0006228 A1    Jan. 4, 2018

(30) Foreign Application Priority Data

Jun. 30, 2016    (KR) .......................... 10-2016-0082421

(51) Int. Cl.
| | |
|---|---|
| H01L 51/00 | (2006.01) |
| B82Y 10/00 | (2011.01) |
| H01L 51/42 | (2006.01) |
| B82Y 30/00 | (2011.01) |

(52) U.S. Cl.
CPC .......... *H01L 51/0036* (2013.01); *B82Y 10/00* (2013.01); *H01L 51/0043* (2013.01); *H01L 51/0046* (2013.01); *H01L 51/0069* (2013.01); *B82Y 30/00* (2013.01); *H01L 51/4233* (2013.01); *H01L 51/4253* (2013.01); *H01L 2251/308* (2013.01); *Y02E 10/549* (2013.01)

(58) Field of Classification Search
None
See application file for complete search history.

(56) References Cited

U.S. PATENT DOCUMENTS

2016/0141499 A1* 5/2016 Yan ..................... C07D 421/14
                                                               136/263

FOREIGN PATENT DOCUMENTS

| CN | 105713185 | * 6/2016 | ............. C08G 61/12 |
|---|---|---|---|
| KR | 2014 0124435 A | 10/2014 | |
| KR | 10-2015-0142834 | 12/2015 | |

OTHER PUBLICATIONS

CN105713185, Fei, Jun. 29, 2016, Machine Translation (Year: 2016).*
Jo, "Fluorination on both D and A units in D-A type conjugated copolymers based on difluorobithiophene and benzothiadiazole for highly efficient polymer solar cells", Energy Environ. Sci., 2015, 8, 2427 (Year: 2015).*
Jo et al. "Fluorination on both D and A Unit in D-A Type conjugated copolymer based on difluorobithiophene and benzothiadiazole for high efficient polymer solar cells," Energy & Environmental Science, 2015, vol. 8, pp. 2427-2434.

* cited by examiner

*Primary Examiner* — Devina Pillay
(74) *Attorney, Agent, or Firm* — Sheridan Ross P.C.

(57) ABSTRACT

The present invention relates to a conductive polymer, the organic photovoltaic cell comprising the same, and the synthesis method of the same. The novel polymer, according to the present invention, displays more excellent optical properties and higher photoelectric conversion efficiency than the conventional RRa (regiorandom) polymer due to its symmetrical structure of quaterthiophene and benzothiadiazole substituted with fluorine.

6 Claims, 6 Drawing Sheets

CONDUCTIVE POLYMERS, THE ORGANIC PHOTOVOLTAIC CELL COMPRISING THE SAME, AND THE SYNTHESIS THEREOF

CROSS-REFERENCE TO RELATED APPLICATIONS

This application claims the benefit of Korean Patent Application No. 10-2016-0082421 filed on Jun. 30, 2016, the contents of which are incorporated herein by reference in its entirety.

BACKGROUND OF THE INVENTION

1. Field of the Invention

The present invention relates to a conductive polymer, the organic photovoltaic cell comprising the same, and the synthesis method of the same, more precisely, a polymer displaying excellent optical properties and high photoelectric conversion efficiency resulted from the symmetrical structure achieved by regulating orientation and the organic photovoltaic cell comprising the polymer, and also the synthesis method of the polymer above.

The conductive polymer according to an example of the present invention can be applied in various photoelectric devices including display units such as organic light emitting diode (OLED), photo detector, organic/inorganic hybrid solar cell, etc.

2. Description of the Related Art

According to the sense of crisis on the exhaustion of petroleum resources, the taking effect of framework convention on climate change of Kyoto Protocol, and the explosive energy demand due to the economic growth of emerging BRICs developing countries, a clean unlimited energy with a totally different concept from the conventional energy is required. Thus, development of new & renewable energy technology is proceeding at national level. In the field of new & renewable energy, solar cell (photovoltaic cell) is the core element of photovoltaic power generation that can convert sunlight directly into electricity, which is now widely used as a power supply from space to home. In the early days when solar cell was first made, it was mainly used in the field of space industry. However, since the two oil fluctuations in 1970s, the solar cell drew our attention with the possibility of using as a power source on the earth. After active studies on it, the solar cell started being used for ground-based power generation from 1980s even though limited. Recently, it has been used in the fields of aviation, weather and communication, and the products such as solar-powered car and air conditioner are in the spotlight.

For the solar cell, silicon or compound semiconductors are used. However, they are produced by semiconductor device manufacturing process, so that the production cost is high. Silicon solar cell that takes the major part of the solar cell has a problem of short supply of silicon raw material. In this situation, studies about an organic photovoltaic cell using low molecular organic materials or polymers instead of using silicon have been promoted. So far, it has been successful to produce a flexible solar cell which can be produced by low-cost process including vacuum process or printing process and is not limited in shape, which draws our attention highly.

A key component of the organic photovoltaic cell is the conjugated polymer. Unlike the silicon solar cell, the conjugated polymer has a high extinction coefficient, so that it can absorb sunlight enough with a thin film (about 100 nm), suggesting that it can be produced as a thin device. Besides, it has such a high quality of polymer as excellent flexibility and workability, so that it can be applied to various fields including construction where silicon solar cell is mainly used. The organic photovoltaic cell has the structure wherein the electron donor (referred as 'D' hereinafter) is conjugated with the electron acceptor (referred as 'A' hereinafter). Once it absorbs visible light, the electron-hole pair is generated in D and electrons move to A, by which the electron-hole is separated and thereby the photovoltaic effect is exhibited. In 1986, C. Tang of Eastman Kodak first proposed the possibility of practical use of the solar cell having a heterostructure of CuPc (copper thalocyanine) and perylene tetracarboxylic derivative. In the early 1990s, Heeger group reported the solar cell generating electricity by using a mixed film of conjugated polymer and fullerene derivative as a photoactive layer, and could improve the efficiency of the cell by developing PCBM up to 4%. Since then, various attempts have been continually made to produce a high efficiency organic photovoltaic cell. In fact, the photoelectric conversion efficiency is now greatly increasing.

A typical organic photovoltaic cell can be composed of a substrate, an anode (transparent electrode) layer, a hole transport layer, a photoactive layer, an electron transfer layer and a cathode. Such a typical organic photovoltaic cell uses ITO (indium tin oxide), which is a transparent electrode having a high work function, as an anode, and Al or Ca having a low work function as a cathode material. In the cell, the photoactive layer is composed of the two layered structure of D and A in about 100 nm thickness or the composite thin film (D+A blend) structure. In some cases, the combined structure wherein the latter composite thin film is inserted in between the two layers of D and A (D/(D+A)/A) is observed. As a buffer layer, a hole transport layer may be inserted in between the ITO (anode) and the photoactive layer or an electron transport layer can be inserted in between the cathode and the photoactive layer. The operation mechanism of the conventional organic photovoltaic cell is as follows. When the organic photovoltaic cell is irradiated with light, the light reaches the photoactive layer through the substrate, the anode, and the hole transport layer, and is absorbed by the electron donor existing in the photoactive layer to form an excited electron-hole pair (exciton). This electron-hole pair diffuses in an arbitrary direction and then separates into electron and hole when it meets the interface of an electron acceptor material. The electron moves to the electron acceptor material having a high electron affinity and the hole remains in the electron donor, resulting in the separation of the electron-hole pair. They are moved to the respective electrodes by the internal magnetic field formed by the work function difference between the electrodes of both sides and by the difference of the accumulated charge concentration, and finally flow in the form of current through the external circuit. However, since the time taken for the electron-hole pair to recombine and disappear is a short time of 100 picoseconds, it is known that the distance that the electron-hole pair can move within the conjugated polymer without recombination is about 10 nm. Therefore, in order for the electrons and holes to be split into two groups without being paired again, the interface between the electron acceptor and the electron donor must be within 10 nm of the place of the electron-hole pair generation.

To achieve a high photoelectric conversion efficiency, the organic photovoltaic cell has to absorb large amounts of light in the photoactive layer and the morphology of the photoactive layer has to be properly regulated in order to induce efficient separation of the electron-hole pair when the electron-hole pair moves to the interface of D and A. Also, there should not be a loss of the separated electrons and holes when they move to the anode and the cathode respectively. Therefore, the polymer used as an electron donor material should have characteristics capable of absorbing large amounts of light and have a property such as high charge carrier mobility capable of effectively transferring the hole to the anode.

The photoactive layer of the organic photovoltaic cell has the structure of bulk-heterojunction composed of electron donor and electron acceptor. As the electron donor, poly(3-hexylthiophene)(P3HT) is widely used and as the electron acceptor, [6,6]-phenyl-C61-butylic acid methyl eater (PC61BM) is widely used. An organic photovoltaic cell based on them has been studied for a long time. P3HT is classified into regioregular (RR) P3HT and regiorandom (RRa) P3HT. RR-P3HT with stereoregularity has improved light absorption and electron mobility than RRa-P3HT. The organic photovoltaic cell based on RR-P3HT:PC61BM shows at least 5% of photoelectric conversion efficiency. Although P3HT is the most studied material in organic photovoltaic cells, its efficiency is limited due to limited light absorption and low maximum possible open circuit voltage (Voc) due to the highest occupied molecular orbital (HOMO). So, other polymers that can give a higher light absorption and enable the regulation of HOMO energy level have been developed.

Particularly, the donor-acceptor (D-A) conjugated polymers and the excellent electron donor polymers having the quinoidal structure have been synthesized and they demonstrate a high photoelectric conversion efficiency as high as at least 10%. Poly(thieno[3,4-b]thiophene) benzodithiophene (referred as 'PTB' hereinafter) polymers such as PTB7-Th based on thieno[3,4-b]thiophene (referred as 'TT' hereinafter) and PBDT-TSR based on benzo[1,2-b:4,5-b']dithiophene (referred as 'BDT' hereinafter) show a high photoelectric conversion efficiency as high as at least 10%.

In general, PTB polymers are synthesized by palladium catalyst stille or Suzuki coupling between TT substituted with bromine (Br) and BDT substituted with tin or boron on both sides. In that case, the PTB polymer has an RRa structure because TT has an asymmetric structure. As explained hereinbefore, since the RR (regioregular) structure is superior to the RRa (regiorandom) structure, a structural change is required for the PTB polymer.

Thus, the present inventors tried to achieve high conversion efficiency by modifying the orientation of BT substituted with fluorine to synthesize a polymer having the RR structure instead of the RRa structure. As a result, the inventors synthesized a novel conductive polymer having a symmetrical structure and thereby a stereoregularity and further completed the present invention by confirming the excellent optical characteristics and photoelectric conversion efficiency of the polymer synthesized above.

PRIOR ART REFERENCE

Patent Reference (Patent Reference 0001) Korean Patent Publication No. 10-2014-0124435

SUMMARY OF THE INVENTION

It is an object of the present invention to provide a polymer for the organic optoelectronic device applicable to various industrial fields by having excellent optical characteristics and photoelectric conversion efficiency.

It is another object of the present invention to provide an organic photovoltaic cell comprising the said polymer having excellent optical characteristics and photoelectric conversion efficiency.

It is also an object of the present invention to provide a method for preparing the polymer having excellent optical characteristics and photoelectric conversion efficiency above.

To achieve the above objects, the present invention provides a polymer represented by formula 1 below.

[Formula 1]

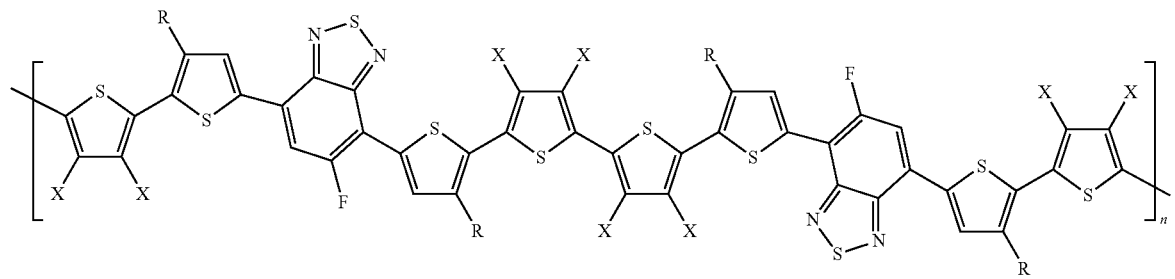

In formula 1, R is independently $C_1$~$C_{30}$ straight or branched alkyl, $C_1$~$C_{30}$ straight or branched alkoxy, or $C_6$~$C_{30}$ aryl, wherein the alkyl, alkoxy, and aryl can be substituted with one or more $C_1$~$C_{10}$ alkyl, hydroxyl, amino, or carboxy, and the alkyl, alkoxy, and aryl can independently contain one or more hetero atoms, X is independently H or F, N is an integer of 1~500.

In a preferred embodiment of the present invention, R of formula 1 can be the one selected from the group consisting of ethylhexyl, butyloctyl, hexyldecyl, and octyldodecyl.

In an example of the present invention, R of formula 1 can be

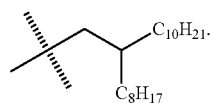

The present invention also provides an organic photovoltaic cell comprising a cathode and an anode opposite to each other; and at least one photoactive layer in between the anode and the cathode, wherein the photoactive layer contains the compound of claim 1 as an electron donor and an electron acceptor.

In a preferred embodiment of the present invention, the electron acceptor can be one or more materials selected from the group consisting of fullerene (C60), fullerene derivative, perylene, perylene derivative, and semiconductor nanoparticle.

In a preferred embodiment of the present invention, the fullerene derivative can be [6,6]-phenyl-C61-butyric acid methyl ether (PCBM) or [6,6]-phenyl-C71-butyric acid methyl ether (PC71BM).

The present invention also provides a method for preparing the polymer represented by formula 1 above, which comprises the following steps: (a) producing the compound represented by formula 2 below having a symmetrical structure by reacting a quaterthiophene derivative and a benzothiadiazole derivative with the substitution of bromine and fluorine in the presence of a palladium catalyst; (b) producing the compound represented by formula 3 below by reacting the compound represented by formula 2 with a brominating agent; and (c) reacting the compound represented by formula 3 with a bithiophene derivative in the presence of a palladium catalyst.

octyldodecyl)-[2,2':5',2":5",2'''-quaterthiophene]-5,5'''-yl) bis(trimethylstannane) or (3",4'-difluoro-3,3'''-bis(2-octyldodecyl)-[2,2':5',2":5",2'''-quaterthiophene]-5,5'''-diyl)bis (trimethylstannane).

In a preferred embodiment of the present invention, the benzothiadiazole derivative compound substituted with bromine and fluorine can be 4-bromo-5-fluoro-7-(4-(2-octyldodecyl)thiophene-2-yl)benzo[c][1,2,5]thiadiazole.

In a preferred embodiment of the present invention, the bithiophene derivative compound can be 5,5'-bis(trimethylstannyl)-2,2'-bithiophene or (3,3'-difluoro-[2,2'-bithiophene]-5,5'-diyl)bis(trimethylstannane).

Advantageous Effect

The novel polymer compound of the present invention has a symmetrical structure of quaterthiophene and benzothiadiazole substituted with fluorine, so that it has more excellent optical properties and higher photoelectric conversion efficiency than the conventional polymer compound having a RRa (regiorandom) structure. Therefore, the polymer of the invention can be effectively used as an electron donor material for the photoactive layer of an organic photovoltaic

[Formula 2]

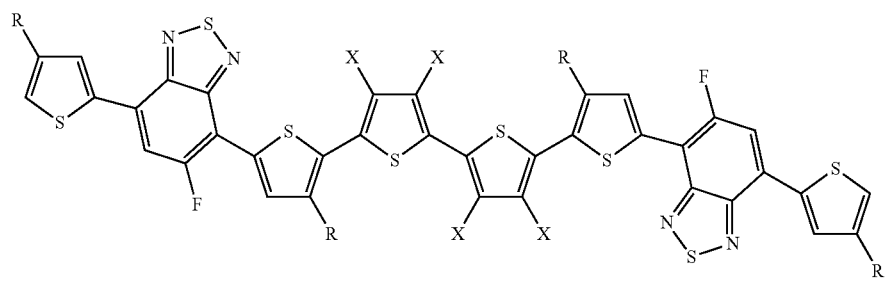

[Formula 3]

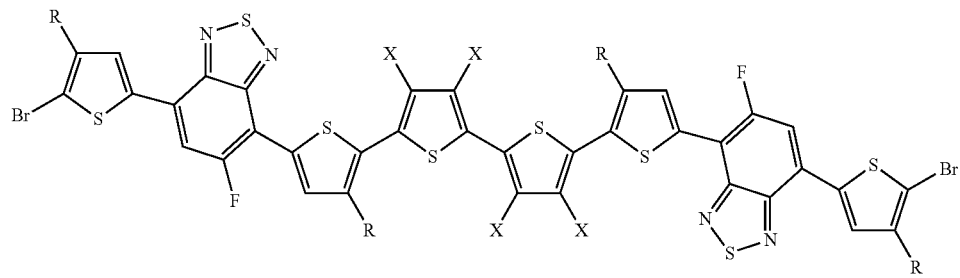

Wherein, R is independently $C_1$~$C_{30}$ straight or branched alkyl, $C_1$~$C_{30}$ straight or branched alkoxy, or $C_6$~$C_{30}$ aryl, wherein the alkyl, alkoxy, and aryl can be substituted with one or more $C_1$~$C_{10}$ alkyl, hydroxyl, amino, or carboxy, and the alkyl, alkoxy, and aryl can independently contain one or more hetero atoms, X is independently H or F, N is an integer of 1~500.

In a preferred embodiment of the present invention, R of formula 1 can be the one selected from the group consisting of ethylhexyl, butyloctyl, hexyldecyl, and octyldodecyl.

In a preferred embodiment of the present invention, the palladium catalyst is selected from the group consisting of PdCl2, Pd(OAc)2, Pd(CH3CN)2Cl2, Pd(PhCN)2Cl2, Pd2(dba)3, and Pd(PPh3)4.

In a preferred embodiment of the present invention, the quaterthiophene derivative compound can be (3,3'''-bis(2- cell device and also can be used as an organic optoelectronic device material applicable to various fields such as OPD, OTFT, and OLED.

BRIEF DESCRIPTION OF THE DRAWINGS

The application of the preferred embodiments of the present invention is best understood with reference to the accompanying drawings, wherein.

DESCRIPTION OF THE PREFERRED EMBODIMENTS

Figure 1:
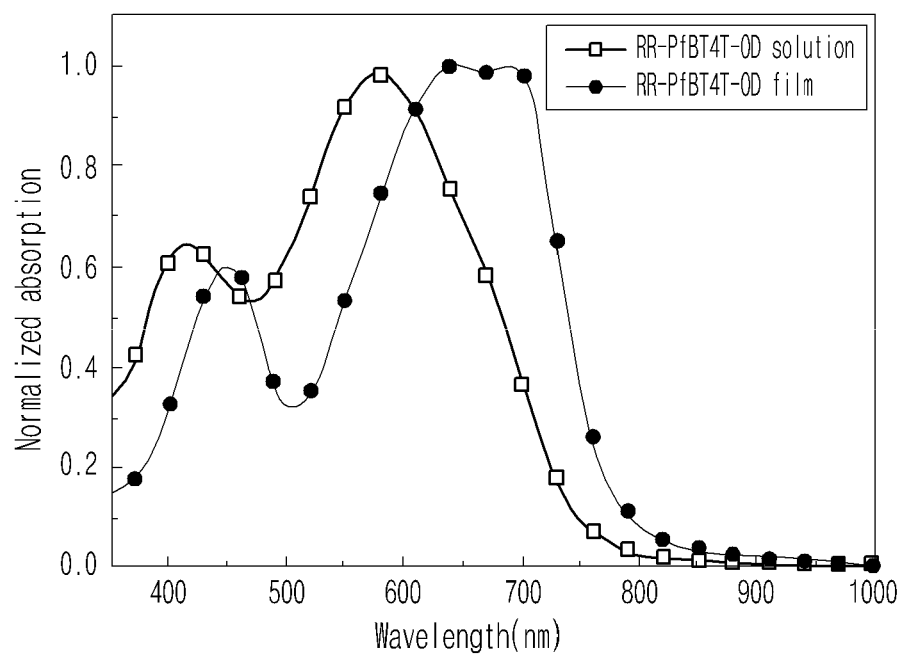
FIG. 1 presents the UV-vis absorption spectra of the polymer compound of the invention (RR PfBT4T-OD) in solution and on film.

Hereinafter, the present invention is described in detail.

The present invention relates to the polymer compound represented by formula 1 below.

Particularly, the present invention relates to an organic photovoltaic cell comprising a cathode and an anode opposite to each other; and at least one photoactive layer in between the anode and the cathode, wherein the photoactive layer contains the polymer compound represented by formula 1 as an electron donor and an electron acceptor.

In a preferred embodiment of the present invention, the electron acceptor can be one or more materials selected from the group consisting of fullerene (C60), fullerene derivative, perylene, perylene derivative, and semiconductor nanoparticle.

The fullerene derivative can be [6,6]-phenyl-C61-butyric acid methyl ether (PCBM) or [6,6]-phenyl-C71-butyric acid methyl ether (PC71BM). The perylene derivative is 3,4,9,10-perylenetetracarboxylic bisbenzimidazole (PTCBI). The

[Formula 1]

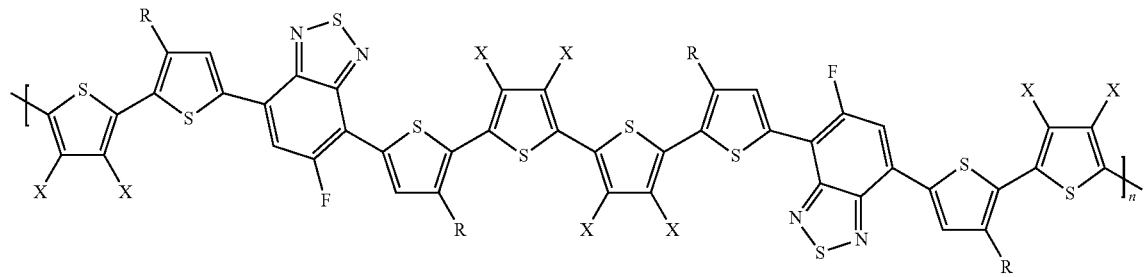

In formula 1, R is independently $C_1$~$C_{30}$ straight or branched alkyl, $C_1$~$C_{30}$ straight or branched alkoxy, or $C_6$~$C_{30}$ aryl, wherein the alkyl, alkoxy, and aryl can be substituted with one or more $C_1$~$C_{10}$ alkyl, hydroxyl, amino, or carboxy, and the alkyl, alkoxy, and aryl can independently contain one or more hetero atoms, X is independently H or F, N is an integer of 1~500.

In a preferred embodiment of the present invention, R of formula 1 can be the one selected from the group consisting of ethylhexyl, butyloctyl, hexyldecyl, and octyldodecyl, and preferably is octyldodecyl.

As confirmed in the experimental example which would be described hereinafter to explain the polymer compound of the invention, the polymer compound of the invention can be used as an optoelectronic device material applicable to organic photovoltaic cell, organic photovoltaic device, display device such as OLED, OTFE, photodetector, organic/inorganic hybrid solar cell, etc, due to the excellent optical properties and high photoelectric conversion efficiency and more preferably used as an electron donor material for the photoactive layer of an organic photovoltaic cell. In a preferred embodiment of the present invention, the display device contains the first electrode, the second electrode, the hole transport layer placed in between the first electrode and the second electrode, and the photoelectric layer comprising an emitting layer. Herein, the photoelectric layer can contain the conductive polymer compound of an example of the invention. In an example of the invention, the photodetector includes a substrate, an electrode disposed on the substrate, and a light receiving layer connected to the electrode. The light receiving layer can contain the conductive polymer of an example of the invention.

The present invention also relates to an organic photovoltaic cell comprising the polymer compound above.

semiconductor nanoparticle can be selected from the group consisting of ZnO, TiO2, CdS, CdSe, and ZnSe.

In another preferred embodiment of the present invention, the organic photovoltaic cell can additionally include a hole transport layer in between the photoactive layer and the anode.

The hole transport layer can be one or more compounds selected from the group consisting of low molecular weight compounds and polymers containing PEDOT:PSS [poly(3, 4-ethylenedioxythiophene):poly(4-styrene sulfonate)], G-PEDOT [poly(3,4-ethylenedioxythiophene):poly(4-styrene sulfonate):polyglycol(glycerol)], PANI:PSS [polyaniline:poly(4-styrene sulfonate)], PANI:CSA (polyaniline: camphor sulfonic acid), PDBT [poly(4,4'-dimethoxy bithiophene)], and arylamine group, and low molecular weight compounds and polymers containing aromatic amine group.

In another preferred embodiment of the present invention, the organic photovoltaic cell can additionally include a electron transport layer in between the photoactive layer and the cathode.

The electron transport layer can be one or more materials selected from the group consisting of ZnO nanoparticle, Doped-ZnO (ZnO:Al, ZnO:B, ZnO:Ga, ZnO:N, etc.) nanoparticle, SnO2 nanoparticle, ITO nanoparticle, and TiO2 nanoparticle in metal oxide sol (or solution), and titanium (diisoproxide)bis(2,4-pentadionate) solution semiconductor nanoparticle in TiOx (1<x<2) sol or Cs2CO3 solution.

In the meantime, a typical organic photovoltaic cell can be composed of a substrate, an anode (transparent electrode) layer, a hole transport layer, a photoactive layer, an electron transfer layer and a cathode. Hereinafter, the organic photovoltaic cell composed of a substrate, an anode, a hole transport layer, a photoactive layer, an electron transfer layer and a cathode, wherein the photoactive layer contains the polymer compound of the invention represented by formula 1 is described in more detail.

The substrate to be placed on the light incidence surface side of the photovoltaic cell has to have light transmittance, which can be colorless and transparent or with some color. For example, such transparent glass substrates as soda-lime glass and alkali-free glass, or plastic films prepared with polyester, polyamide, or epoxy resin can be used. As the transparent electrode, any transparent material is usable as long as it has an electrical conductivity, which is preferably exemplified by single or complex metal oxide of indium (In), tin (Sn), gallium (Ga), zinc (Zn), and aluminum (Al) such as In2O3, ITO (indium-tin oxide), IGZO (indium-galliumzincoxide), ZnO, AZO (Aluminum-zinc oxide; ZnO:Al), SnO2, FTO (Fluorine-dopedtin oxide; SnO2:F), and ATO (Aluminum-tin oxide; SnO2:Al). Such transparent electrode can be formed by DC sputtering or chemical vapor deposition (CVD), atomic layer deposition (ALD), sol-gel coating, or electroplating. The electrode formed on the substrate may be immersed in acetone, alcohol, water or a mixed solution thereof, followed by ultrasonic cleaning.

As a material for the hole transport layer, a compound that has excellent characteristics of transporting holes, blocking electrons, and forming a thin film is preferred. Particularly, low molecular weight compounds and polymers containing PEDOT:PSS [poly(3,4-ethylenedioxythiophene):poly(4-styrene sulfonate)], G-PEDOT [poly(3,4-ethylenedioxythiophene):poly(4-styrene sulfonate):polyglycol(glycerol)], PANI:PSS [polyaniline:poly(4-styrene sulfonate)], PANI:CSA (polyaniline:camphor sulfonic acid), PDBT [poly(4,4'-dimethoxy bithiophene)], and arylamine group, and low molecular weight compounds and polymers containing aromatic amine group are preferred, but not always limited thereto. A method for forming the hole transport layer is exemplified by spin coating, spray coating, screen printing, bar coating, doctor blade coating, and vacuum thermal evaporation. The thickness of the hole transport layer is preferably 5~300 nm.

The photoactive layer is formed with the conductive polymer containing the polymer compound represented by formula 1 as an electron donor and an electron acceptor. The electron acceptor herein can be fullerene (C60), fullerene derivative such as [6,6]-phenyl-C61-butyric acid methyl ether (PCBM) or [6,6]-phenyl-C71-butyric acid methyl ether (PC71BM), perylene, perylene derivative such as 3,4,9,10-perylenetetracarboxylic bisbenzimidazole (PTCBI), or semiconductor nanoparticle such as ZnO, TiO2, CdS, CdSe, or ZnSe. At this time, the size of the nanoparticle is preferably 1~100 nm, but not always limited thereto. The photoactive layer is formed by using the polymer compound represented by formula 1 and the electron acceptor mixture solution. At this time, polar solvents such as chloroform, chlorobenzene, 1,2-dichlorobenzene, 1,2,4-trichlorobenzene, and toluene can be used as a solvent. The method for forming the photoactive layer is exemplified by spin coating, spray coating, and screen printing, etc.

The pattern of the electron transport layer can be formed by inkjet method, offset printing, or gravure printing using a metal precursor sol (or solution). Or, a n-type metal oxide nanoparticle is first prepared, which is then spread in a dispersive medium together with an additive, resulting in the formula form of ink, slurry, or paste, with which the pattern can be formed by one of the methods above. The metal oxide sol (or solution) and the metal oxide nanoparticle can be exemplified by ZnO nanoparticle, Doped-ZnO (ZnO:Al, ZnO:B, ZnO:Ga, ZnO:N, etc.) nanoparticle, SnO2 nanoparticle, ITO nanoparticle, TiO2 nanoparticle, TiOx (1<x<2) sol, Cs2CO3 solution, and titanium(diisoproxide)bis(2,4-pentadionate) solution. The electron transport layer can be formed with organic materials. The coating above can be achieved by spin coating, spray coating, screen printing, bar coating, doctor blade coating, flexography, and gravure printing. When a material to form the electron transport layer is a low molecule organic material, it is not necessarily dissolved in a solvent but can proceed to vacuum thermal evaporation.

The cathode is an electrode to collect electrons that are generated in the photoactive layer efficiently. It is preferable to use an electrode material made of a metal having a small work function, an alloy, a conductive compound, or a mixture thereof. The material for the cathode, therefore, is exemplified by alkali metals, alkali metal halides, alkali metal oxides, rare earths and alloys of these with other metals such as sodium-potassium alloys, magnesium-silver mixtures, aluminum-lithium alloys, and aluminum-lithium fluorine double layer. A film can be generated with the electrode material by sputtering or vacuum evaporation, but not always limited thereto.

The present invention also relates to a method for preparing the polymer compound represented by formula 1.

Particularly, the method for preparing the polymer compound represented by formula 1 of the invention comprises the following steps: (a) producing the compound represented by formula 2 below having a symmetrical structure by reacting a quaterthiophene derivative and a benzothiadiazole derivative with the substitution of bromine and fluorine in the presence of a palladium catalyst; (b) producing the compound represented by formula 3 below by reacting the compound represented by formula 2 with a brominating agent; and (c) reacting the compound represented by formula 3 with a bithiophene derivative in the presence of a palladium catalyst.

[Formula 2]

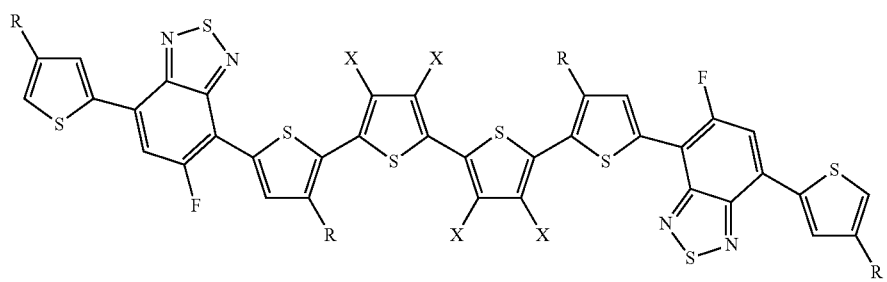

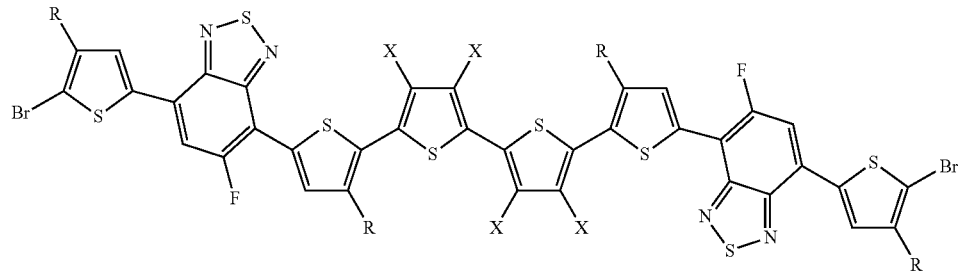

[Formula 3]

Wherein, R is independently $C_1$~$C_{30}$ straight or branched alkyl, $C_1$~$C_{30}$ straight or branched alkoxy, or $C_6$~$C_{30}$ aryl, wherein the alkyl, alkoxy, and aryl can be substituted with one or more $C_1$~$C_{10}$ alkyl, hydroxyl, amino, or carboxy, and the alkyl, alkoxy, and aryl can independently contain one or more hetero atoms, X is independently H or F, N is an integer of 1~500.

In a preferred embodiment of the present invention, R of formula 1 can be the one selected from the group consisting of ethylhexyl, butyloctyl, hexyldecyl, and octyldodecyl, and preferably is octyldodecyl.

In a preferred embodiment of the present invention, the palladium catalyst is selected from the group consisting of PdCl2, Pd(OAc)2, Pd(CH3CN)2Cl2, Pd(PhCN)2Cl2, Pd2(dba)3, and Pd(PPh3)4.

In a preferred embodiment of the present invention, the quaterthiophene derivative compound can be (3,3'''-bis(2-octyldodecyl)-[2,2':5',2'':5'',2'''-quaterthiophene]-5,5'''-yl)bis(trimethylstannane) or (3'',4'-difluoro-3,3'''-bis(2-octyldodecyl)-[2,2':5',2'':5'',2'''-quaterthiophene]-5,5'''-diyl)bis(trimethylstannane). The benzothiadiazole derivative compound substituted with bromine and fluorine can be 4-bromo-5-fluoro-7-(4-(2-octyldodecyl)thiophene-2-yl)benzo[c][1,2,5]thiadiazole.

In a preferred embodiment of the present invention, the bithiophene derivative compound can be 5,5'-bis(trimethylstannyl)-2,2'-bithiophene or (3,3'-difluoro-[2,2'-bithiophene]-5,5'-diyl)bis(trimethylstannane).

In the meantime, the polymer compound represented by formula 1 can be prepared by the process of reaction formula 1 below in example 1 or by the process of reaction formula 2 in example 2 which will be illustrated hereinafter.

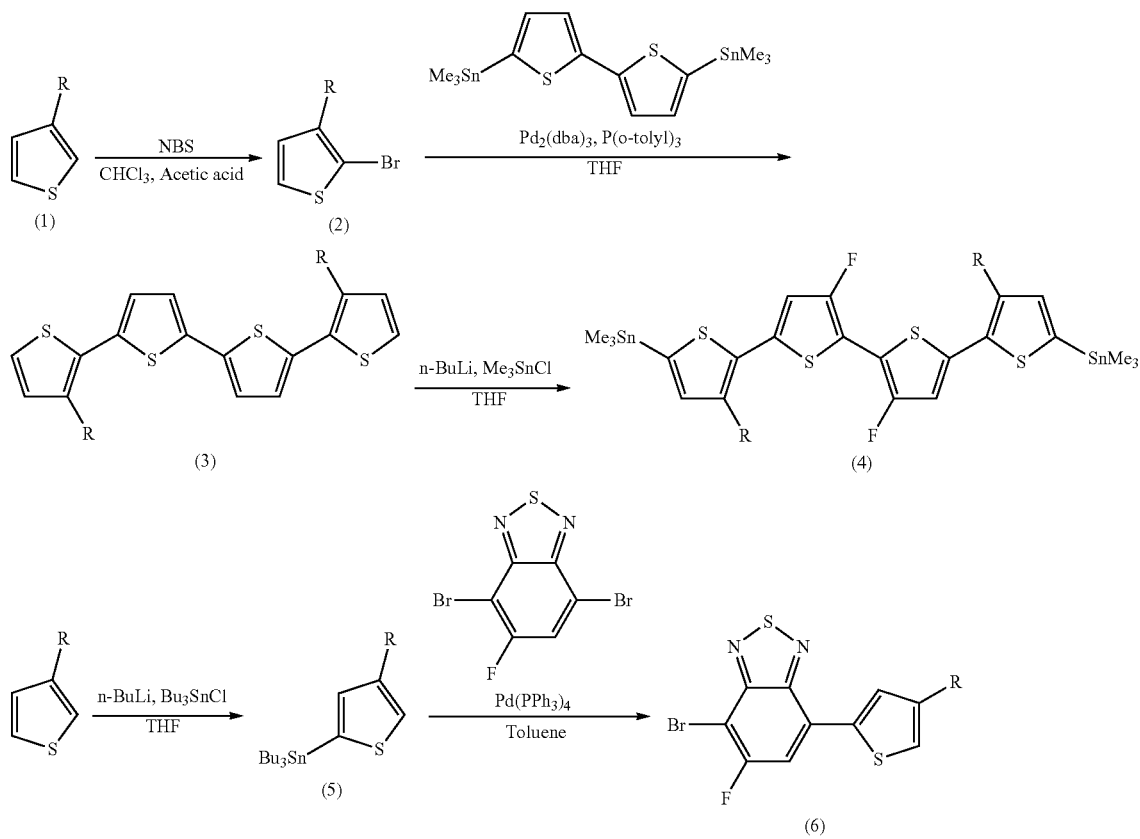

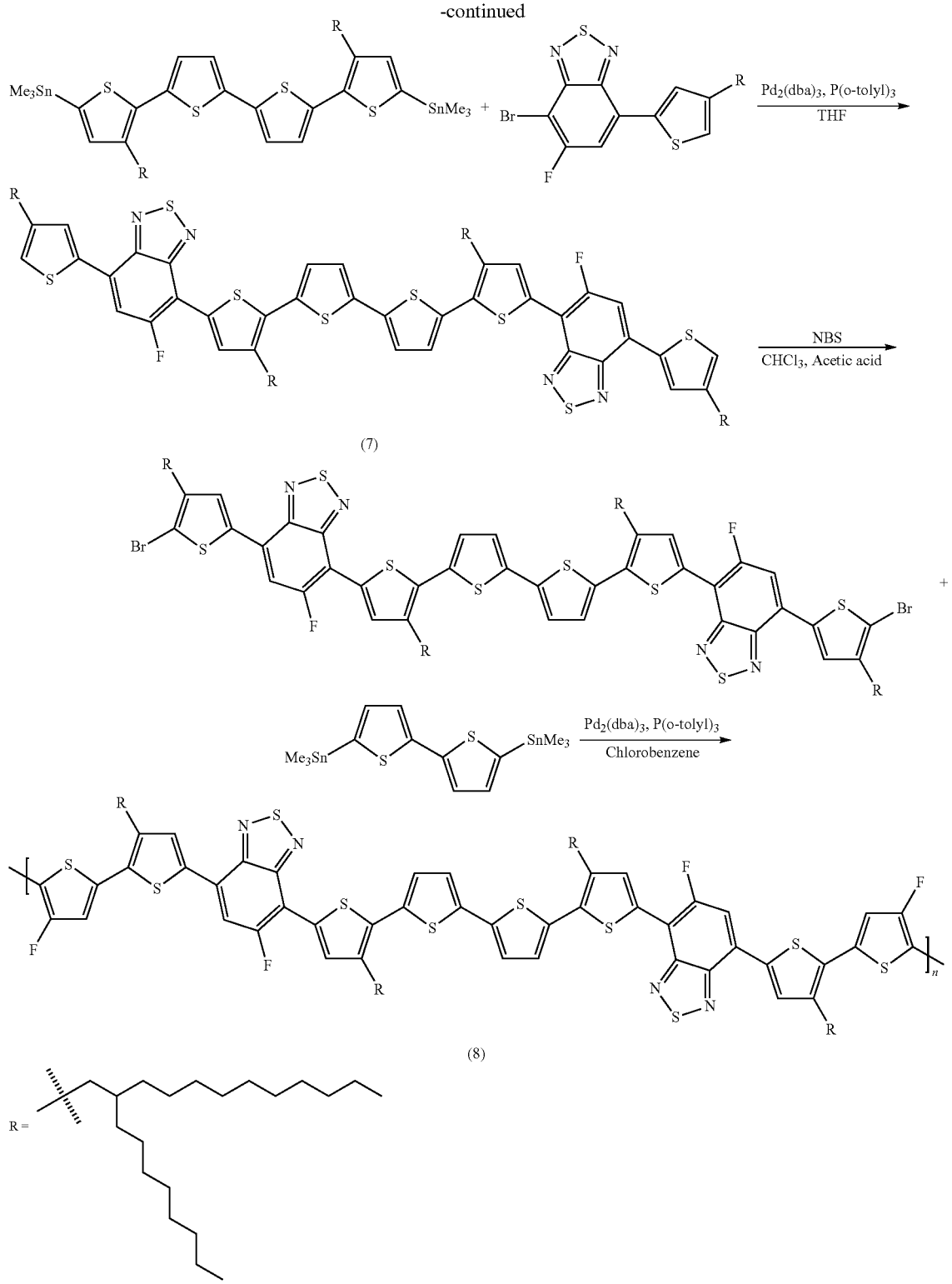

(7)

(8)

As shown in reaction formula 1 above, N-bromosuccinimide (NBS), chloroform, and acetic acid were added to 3-(2-octyldodecyl)thiophene (1) compound, resulting in the synthesis of 2-bromo-3-(2-octyldodecyl)thiophene (2) compound. To the compound (2) were added 5,5'-bis(trimethylstannyl)-2,2'-bithiophene, palladium catalyst (Pd2(dba)3), P(o-tolyl)3, and tetrahydrofuran (THF) solvent, leading to the synthesis of 3,3'''-bis(2-octyldodecyl)-2,2':5',2'':5'',2'''-quaterthiophene (3) compound. The compound (3) was dissolved in tetrahydrofuran (THF) solvent, to which n-BuLi and trimethyltin chloride were added stepwise, followed by reaction to synthesize (3,3'''-bis(2-octyldodecyl)-[2,2':5',2'':

5",2'''-quaterthiophene]-5,5'''-diyl)bis(trimethylstannane) (4) compound. In the mean time, 3-(2-octyldodecyl)thiophene was dissolved in tetrahydrofuran (THF) solvent, to which n-BuLi and trimethyltin chloride were added stepwise, leading to the reaction to synthesize tributyl(4-(2-octyldodecyl)thiophene-2-yl)stannane (5) compound, and then 4,7-dibromo-5-fluorobenzo[c][1,2,5]thiadiazole, a palladium catalyst, and toluene were added to the compound (5), followed by reaction to synthesize 4-bromo-5-fluoro-7-(4-(2-octyldodecyl)thiophene-2-yl)benzo[c][1,2,5]thiadiazole (6) compound. Then, a palladium catalyst (Pd2(dba)3), P(o-tolyl)3, and tetrahydrofuran (THF) solvent were added to the (3,3'''-bis(2-octyldodecyl)-[2,2':5',2":5",2'''-quaterthiophene]-5,5'''-diyl)bis(trimethylstannane) (4) compound and the 4-bromo-5-fluoro-7-(4-(2-octyldodecyl)thiophene-2-yl)benzo[c][1,2,5]thiadiazole (6) compound, followed by reaction to synthesize 7,7'-(3,3'''-bis(2-octyldodecyl)-[2,2':5',2":5",2'''-quaterthiophene]-5,5'''-diyl)bis(6-fluoro-4-(4-(2-octyldodecyl)thiophene-2-yl)benzo[c][1,2,5]thiadiazole) (7) compound. To the compound (7) were added a brominating agent (N-bromosuccinimide: NBS), chloroform, and acetic acid, leading to the reaction to introduce a bromine group to the compound (7). The brominated 7,7'-(3,3'''-bis(2-octyldodecyl)-[2,2':5',2":5",2'''-quaterthiophene]-5,5'''-diyl)bis(4-(5-bromo-4-(2-octyldodecyl)thiophene-2-yl)-6-fluorobenzo[c][1,2,5]thiadiazole) compound (7) was added with 5,5'-bis(trimethylstannyl)-2,2'-bithiophene, a palladium catalyst (Pd2(dba)3), P(o-tolyl)3, and chlorobenzene solvent, leading to the final reaction to synthesize the polymer compound of the present invention which was 'RRPfBT4T-OD' represented by formula 1.

[Reaction Formula 2]

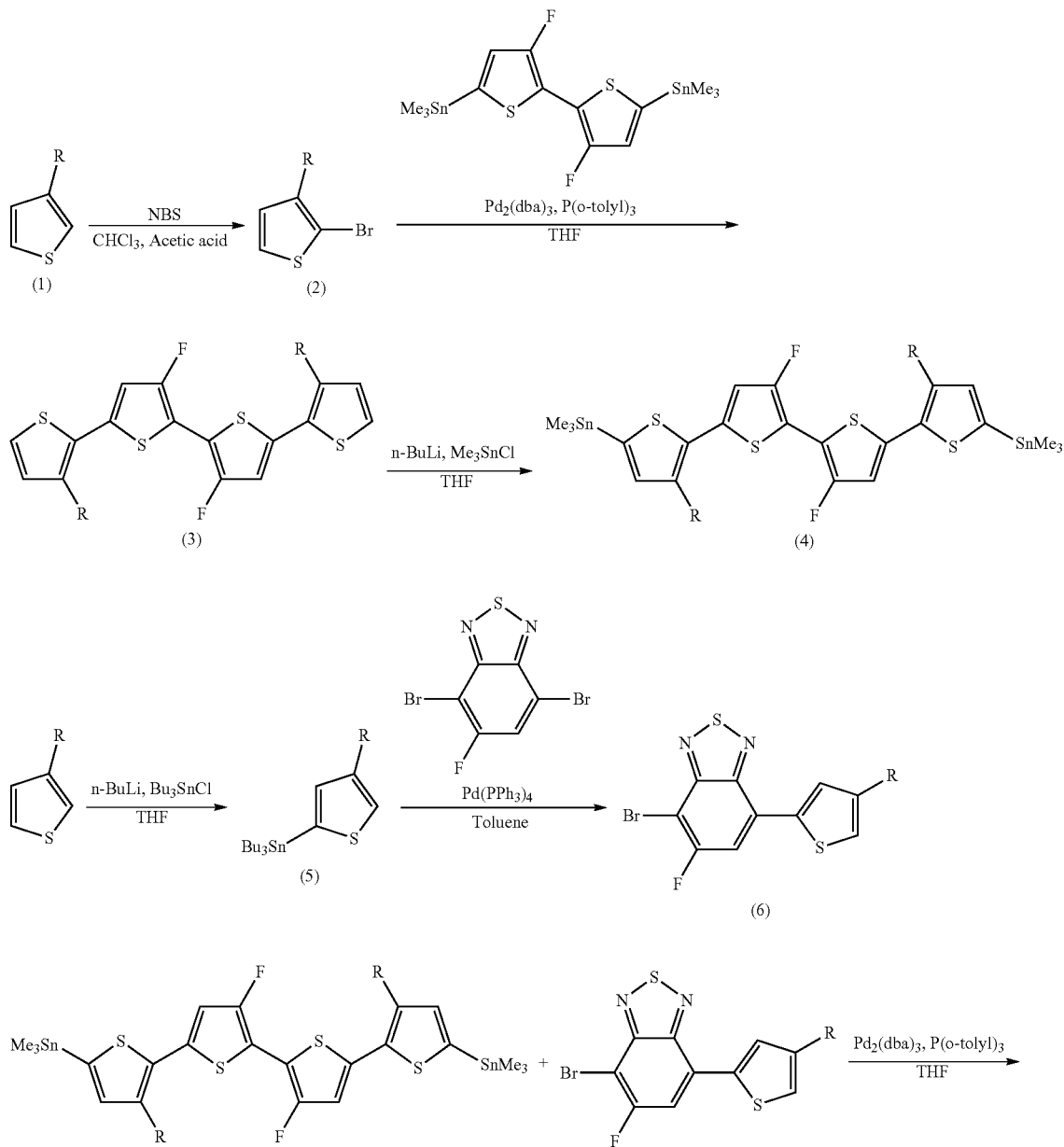

-continued
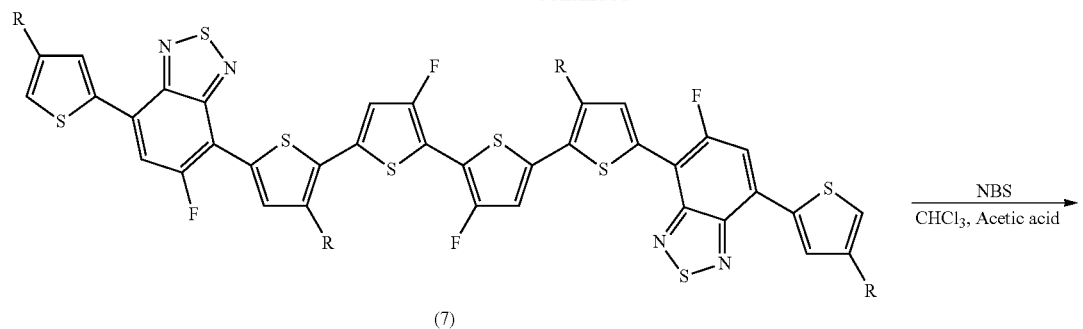
(7)
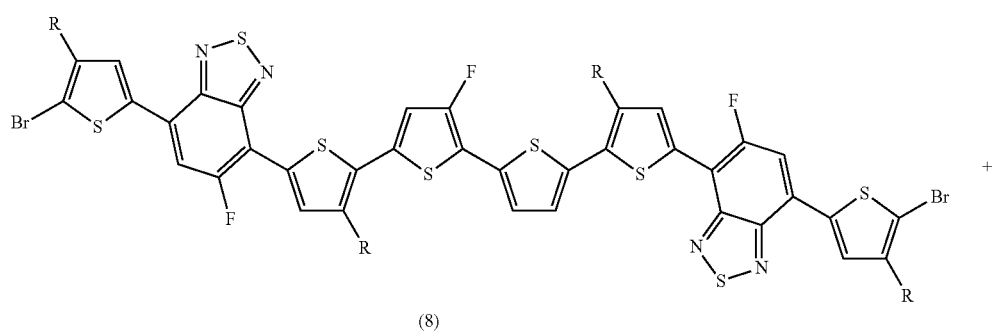
(8) +
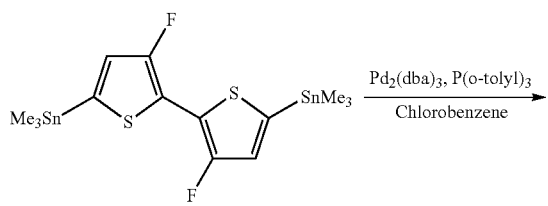
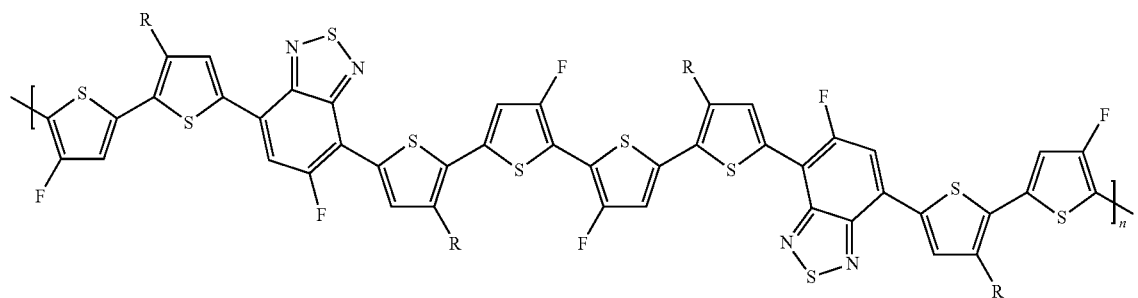
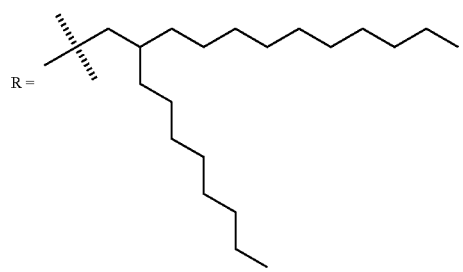

As shown in reaction formula 2, N-bromosuccinimide (NBS), chloroform, and acetic acid were added to 3-(2-octyldodecyl)thiophene (1) compound, followed by reaction to synthesize 2-bromo-3-(2-octyldodecyl)thiophene (2) compound. The compound (2) was added with (3,3'-difluoro-[2,2'-bithiophene]-5,5'-diyl)bis(trimethylstannane), a palladium catalyst (Pd2(dba)3), P(o-tolyl)3, and tetrahydrofuran (THF) solvent, followed by reaction to synthesize 3",4'-difluoro-3,3'''-bis(2-octyldodecyl)-2,2':5',2":5",2'''-quaterthiophene (3) compound. The compound (3) was dissolved in tetrahydrofuran (THF) solvent, to which n-BuLi and trimethyltin chloride were added stepwise, followed by reaction to synthesize (3",4'-difluoro-3,3'''-bis(2-octyldodecyl)-[2,2':5',2":5",2'''-quaterthiophene]-5,5'''-diyl)bis(trimethylstannane) (4) compound. In the meantime, 3-(2-octyldodecyl)thiophene was dissolved in tetrahydrofuran (THF) solvent, to which n-BuLi and trimethyltin chloride were added stepwise, followed by reaction to synthesize tributyl (4-(2-octyldodecyl)thiophene-2-yl)stannane (5) compound. The compound (5) was added with 4,7-dibromo-5-fluorobenzo[c][1,2,5]thiadiazole, a palladium catalyst, and toluene, followed by reaction to synthesize 4-bromo-5-fluoro-7-(4-(2-octyldodecyl)thiophene-2-yl)benzo[c][1,2,5]thiadiazole (6) compound. A palladium catalyst (Pd2(dba)3), P(o-tolyl)3, tetrahydrofuran (THF) solvent were added to the (3",4'-difluoro-3,3'''-bis(2-octyldodecyl)-[2,2':5',2":5",2'''-quaterthiophene]-5,5'''-diyl)bis(trimethylstannane) (4) compound and the 4-bromo-5-fluoro-7-(4-(2-octyldodecyl)thiophene-2-yl)benzo[c][1,2,5]thiadiazole (6) compound synthesized above, followed by reaction to synthesize 7,7'-(3",4'-difluoro-3,3'''-bis(2-octyldodecyl)-[2,2':5',2":5",2'''-quaterthiophene]-5,5'''-diyl)bis(6-fluoro-4-(4-(2-octyldodecyl)thiophene-2-yl)benzo[c][1,2,5]thiadiazole) (7) compound. To the compound (7) were added a brominating agent (N-bromosuccinimide: NBS), chloroform, and acetic acid, leading to the reaction to introduce a bromine group to the compound (7). As a result, 7,7'-(3",4'-difluoro-3,3'''-bis(2-octyldodecyl)-[2,2':5',2":5",2'''-quarter thiophene]-5,5'''-diyl)bis(4-(5-bromo-4-(2-octyldodecyl)thiophene-2-yl)-6-fluorobenzo[c][1,2,5]thiadiazole) (8) compound was synthesized. The compound (8) was added with (3,3'-difluoro-[2,2'-bithiophene]-5,5'-diyl)bis(trimethylstannane), a palladium catalyst (Pd2(dba)3), P(o-tolyl)3, and chlorobenzene solvent, leading to the final reaction to synthesize the polymer compound of the present invention which was 'RR PfBTff4TOD' represented by formula 2.

Practical and presently preferred embodiments of the present invention are illustrative as shown in the following Examples.

However, it will be appreciated that those skilled in the art, on consideration of this disclosure, may make modifications and improvements within the spirit and scope of the present invention.

Example 1: Synthesis of RR-PFBT4T-OD Polymer

<1-1> Synthesis of 2-bromo-3-(2-octyldodecyl)thiophene

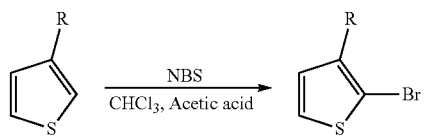

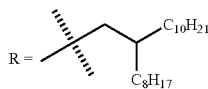

3-(2-Octyldodecyl)thiophene (2.00 g, 5.48 mmol), NBS (N-bromosuccinimide, 1.07 g, 6.03 mmol), chloroform (20 ml), and acetic acid (20 ml) were added in a 100 ml flask equipped with a nitrogen purge tube, followed by reaction at room temperature for one day. The reactant was extracted with distilled water and MC. Then, moisture in the organic layer was dried over anhydrous sodium sulfate. The solid impurities were removed by filtration under reduced pressure. The remaining solvent was eliminated by evaporation, and the residue was separated by column chromatography (hexane). As a result, 2.21 g of the target compound was obtained as clear transparent oil (yield: 91.2%).

$^1$H NMR (400 MHz, CDCl3) δ (ppm): 7.11 (d, 1H), 6.74 (d, 2H), 2.48 (d, 2H), 1.25 (m, 33H), 0.88 (m, 6H).

<1-2> Synthesis of 3,3'''-bis(2-octyldodecyl)-2,2':5',2":5",2'''-quaterthiophene

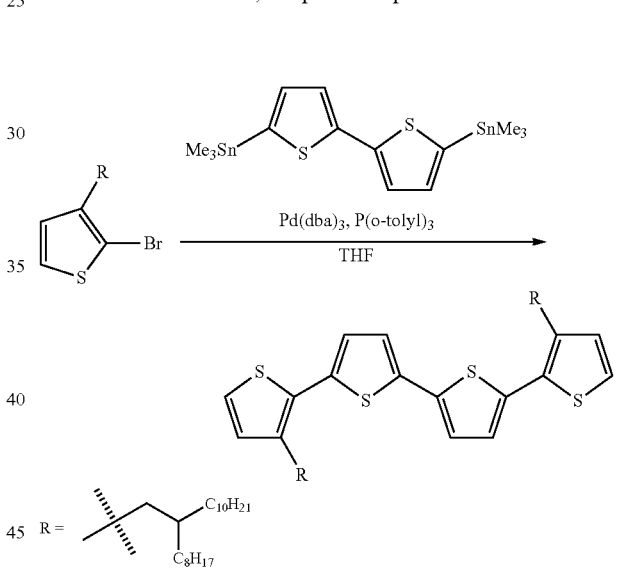

2-Bromo-3-(2-octyldodecyl)thiophene (2.21 g, 5.00 mmol) synthesized in Example <1-1> was mixed with 5,5'-bis(trimethylstannyl)-2,2'-bithiophene (1.11 g, 2.27 mmol), Pd2(dba)3 (0.08 g, 0.09 mmol), P(o-tolyl)3 (0.05 g, 0.18 mmol), and THF (tetrahydrofuran, 20 ml) in a 100 ml flask equipped with a reflux condenser, followed by reflux stirring in an oil bath at 70° C. The reactant was cooled down at room temperature, followed by extraction several times with diethyl ether. Then, moisture in the organic layer was dried over anhydrous sodium sulfate. The solid impurities were removed by filtration under reduced pressure. The remaining solvent was eliminated by evaporation, and the residue was separated by column chromatography (hexane). As a result, 1.11 g of the target compound was obtained as transparent yellow oil (yield: 55.4%).

$^1$H NMR (400 MHz, CDCl3) δ (ppm): 7.17 (d, 2H), 7.10 (d, 2H), 7.00 (d, 2H), 6.90 (d, 2H), 2.71 (d, 4H), 1.68 (m, 2H), 1.22 (m, 64H), 0.88 (m, 12H)

<1-3> Synthesis of (3,3'''-bis(2-octyldodecyl)-[2,2': 5',2'':5'',2'''-quaterthiophene]-5,5'''-diyl)bis(trimethylstannane)

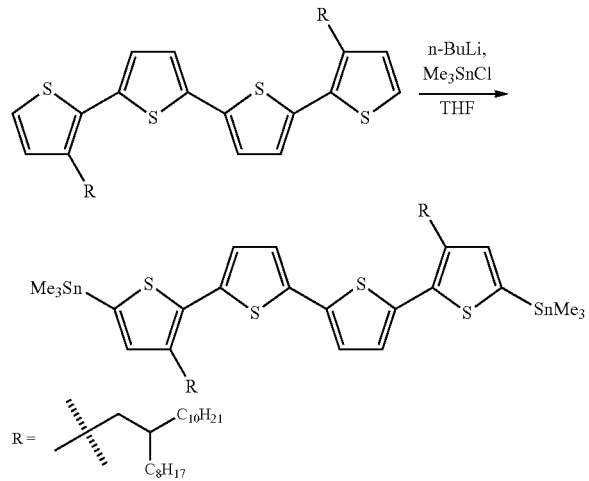

After eliminating moisture through frame dry, 3,3'''-Bis(2-octyldodecyl)-2,2':5',2'':5'',2'''-quaterthiophene (1.10 g, 1.24 mmol) synthesized in Example <1-2> and 15 ml of anhydrous THF (tetrahydrofuran) were loaded in a 100 ml flask equipped with a nitrogen purge tube, whose temperature was adjusted to be −78° C. with acetone and dry ice. 2.5 M n-BuLi (3.1 mmol, 1.24 ml) was slowly added thereto little by little, followed by reaction at −78° C. for 30 minutes. Then, the reaction was induced again at room temperature for 30 minutes. The temperature was dropped down again to −78° C., to which 1 M trimethyltin chloride (3.1 mmol, 3.1 ml) was added, followed by reaction at room temperature for one day. Extraction was performed by using distilled water and diethyl ether. Then, moisture in the organic layer was dried over anhydrous sodium sulfate. The solid impurities were removed by filtration under reduced pressure. The remaining solvent was eliminated by evaporation. As a result, the target compound was obtained as transparent brown oil (0.98 g, yield: 64.9%).

$^1$H NMR (400 MHz, CDCl3) δ (ppm): 7.08 (d, 2H), 6.99 (d, 2H), 6.94 (s, 2H), 6.90 (d, 1H), 2.72 (d, 4H), 1.70 (m, 2H), 1.22 (m, 64H), 0.88 (m, 12H), 0.37 (s, 18H)

<1-4> Synthesis of tributyl(4-(2-octyldodecyl)thiophene-2-yl)stannane

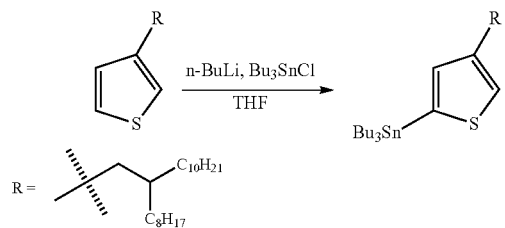

After eliminating moisture through frame dry, 3-(2-octyldodecyl)thiophene (2.00 g, 5.48 mmol) and 15 ml of anhydrous THF (tetrahydrofuran) were loaded in a 100 ml flask equipped with a nitrogen purge tube, whose temperature was adjusted to be −78° C. with acetone and dry ice. 2.5 M n-BuLi (13.7 mmol, 5.48 ml) was slowly added thereto little by little, followed by reaction at −78° C. for 30 minutes. Then, the reaction was induced again at room temperature for 30 minutes. The temperature was dropped down again to −78° C., to which tributyltin chloride (13.7 mmol, 4.45 g) was added, followed by reaction at room temperature for one day. Extraction was performed by using distilled water and diethyl ether. Then, moisture in the organic layer was dried over anhydrous sodium sulfate. The solid impurities were removed by filtration under reduced pressure. The remaining solvent was eliminated by evaporation. As a result, the target compound was obtained as transparent brown oil (3.14 g, yield: 87.7%). The reaction was carried out without any purification process.

<1-5> Synthesis of 4-bromo-5-fluoro-7-(4-(2-octyldodecyl)thiophene-2-yl)benzo[c][1,2,5]thiadiazole

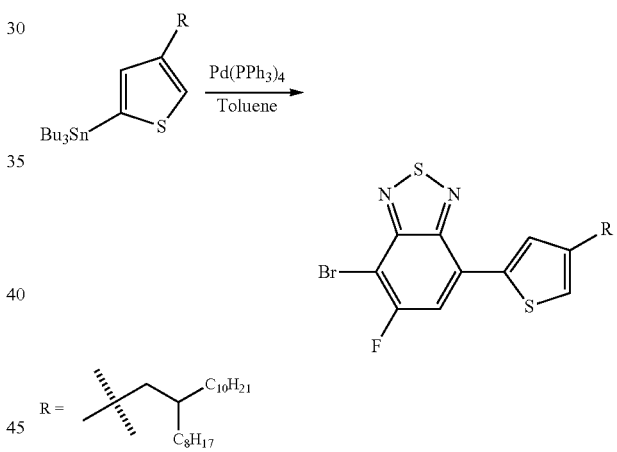

Tributyl(4-(2-octyldodecyl)thiophen-2-yl)stannane (3.14 g, 4.80 mmol) synthesized in Example <1-4> was mixed with 4,7-dibromo-5-fluorobenzo[c][1,2,5]thiadiazole (1.79 g, 5.76 mmol), Pd(PPh3)4 (0.27 g, 0.24 mmol), and toluene (15 ml) in a 100 ml flask equipped with a reflux condenser, followed by reflux stirring in an oil bath for 16 hours. The reactant was cooled down at room temperature, followed by extraction several times with MC. Then, moisture in the organic layer was dried over anhydrous sodium sulfate. The solid impurities were removed by filtration under reduced pressure. The remaining solvent was eliminated by evaporation, and the residue was separated by column chromatography (hexane). As a result, 1.66 g of the target compound was obtained as transparent yellow oil (yield: 58.5%).

$^1$HNMR (400 MHz, CDCl3) δ (ppm): 7.97 (s, 1H), 7.70 (d, 1H), 7.11 (s, 1H), 2.64 (d, 2H), 1.71 (m, 1H), 1.30 (m, 32H), 0.89 (m, 6H)

<1-6> Synthesis of 7,7'-(3,3'''-bis(2-octyldodecyl)-[2,2':5',2'':5'',2'''-quaterthiophene]-5,5'''-diyl)bis(6-fluoro-4-(4-(2-octyldodecyl)thiophene-2-yl)benzo[c][1,2,5]thiadiazole)

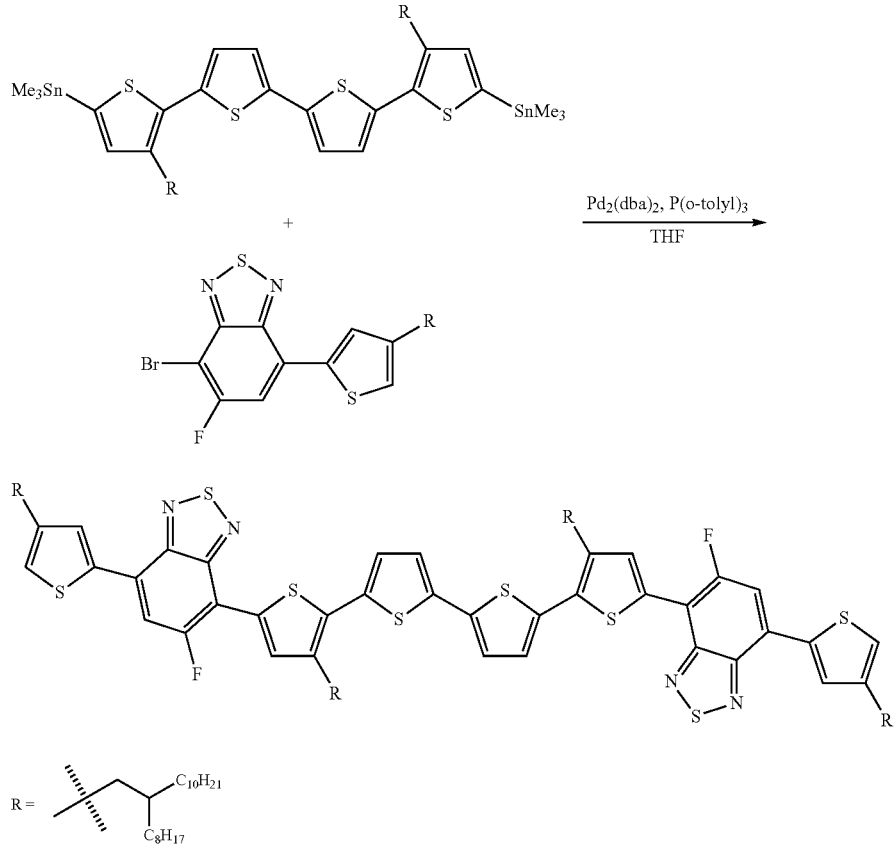

(3,3'''-Bis(2-octyldodecyl)-[2,2':5',2'':5'',2'''-quaterthiophene]-5,5'''-diyl)bis(trimethylstannane) (0.98 g, 0.81 mmol) synthesized in Example <1-3>, 4-Bromo-5-fluoro-7-(4-(2-octyldodecyl)thiophen-2-yl)benzo[c][1,2,5]thiadiazole (1.06 g, 1.78 mmol) synthesized in Example <1-5>, Pd2(dba)3 (0.016 mmol, 0.02 mmol), P(o-tolyl)3 (0.06 mmol, 0.02 g), and 15 ml of THF (tetrahydrofuran) were added in a 100 ml flask equipped with a reflux condenser, followed by reflux stirring in an oil bath for 16 hours. The reactant was cooled down at room temperature, followed by extraction several times with distilled water and MC (methylene chloride). Then, moisture in the organic layer was dried over anhydrous sodium sulfate. The solid impurities were removed by filtration under reduced pressure. The remaining solvent was eliminated by evaporation, and the residue was separated by column chromatography (MC: HEX=1:20). As a result, 0.46 g of the target compound was obtained as a red solid (yield: 30.1%).

$^1$H NMR (400 MHz, CDCl3) δ (ppm): 8.10 (s, 2H), 7.96 (s, 2H), 7.75 (d, 2H), 7.18 (s, 4H), 7.07 (s, 2H), 2.84 (d, 4H), 2.63 (d, 4H), 1.83 (m, 2H), 1.69 (m, 2H), 1.24 (m, 128H), 0.86 (m, 24H)

<1-7> Synthesis of 7,7'-(3,3'''-bis(2-octyldodecyl)-[2,2':5',2'':5'',2'''-quaterthiophene]-5,5'''-diyl)bis(4-(5-bromo-4-(2-octyldodecyl)thiophene-2-yl)-6-fluorobenzo[c][1,2,5]thiadiazole)

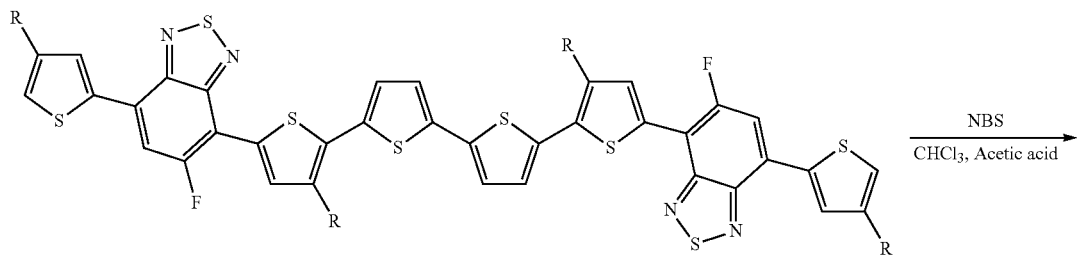

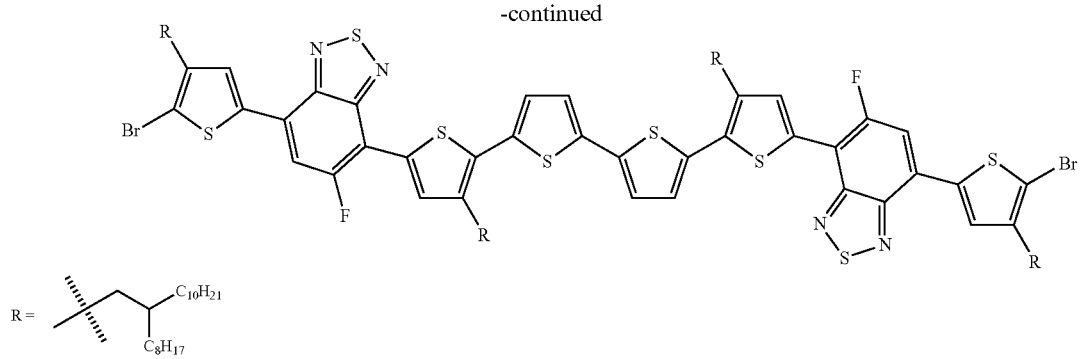

7,7'-(3,3'''-Bis(2-octyldodecyl)-[2,2':5',2'':5'',2'''-quaterthiophene]-5,5'''-diyl)bis(6-fluoro-4-(4-(2-octyldodecyl)thiophen-2-yl)benzo[c][1,2,5]thiadiazole) (0.46 g, 0.24 mmol) synthesized in Example <1-6>, NBS (N-bromosuccinimide) (0.093 g, 0.52 mmol), 10 ml of chloroform, and 10 ml of acetic acid were added in a 100 ml flask equipped with a nitrogen purge tube, followed by reaction at room temperature. Extraction was performed several times by using distilled water and MC (methylene chloride). Then, moisture in the organic layer was dried over anhydrous sodium sulfate. The solid impurities were removed by filtration under reduced pressure. The remaining solvent was eliminated by evaporation, and the residue was separated by column chromatography (MC:HEX=1:25). As a result, 0.37 g of the target compound was obtained as a purple solid (yield: 75.2%).

$^1$HNMR (400 MHz, CDCl3) δ (ppm): 8.10 (s, 2H), 7.72 (s, 2H), 7.65 (d, 2H), 7.17 (s, 4H), 2.83 (d, 4H), 2.56 (d, 4H), 1.83 (m, 2H), 1.75 (m, 2H), 1.24 (m, 128H), 0.86 (m, 24H)

<1-8> Synthesis of RR-PfBT4T-OD

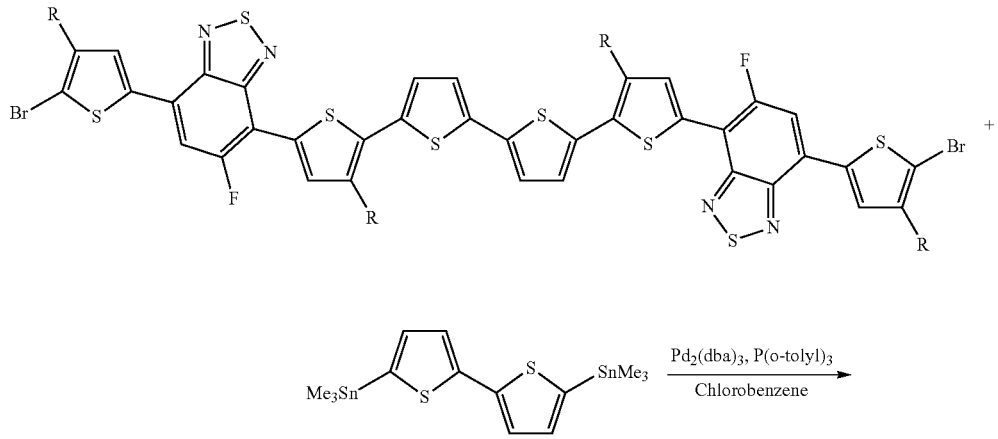

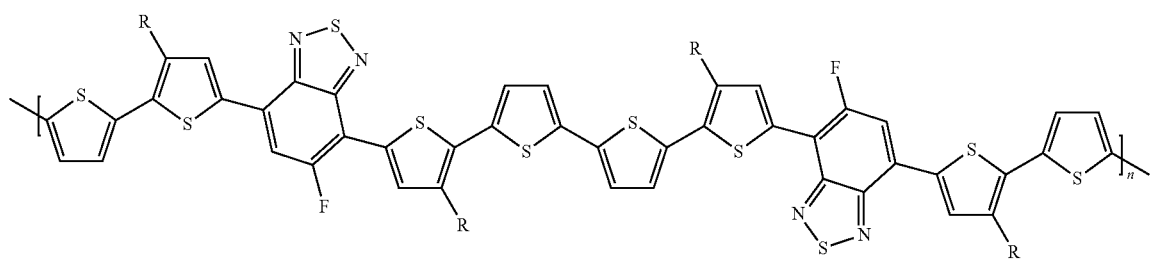

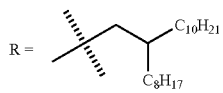

7,7'-(3,3'''-bis(2-octyldodecyl)-[2,2':5',2'':5'',2'''-quaterthiophene]-5,5'''-diyl)bis(4-(5-bromo-4-(2-octyldodecyl)thiophen-2-yl)-6-fluorobenzo[c][1,2,5]thiadiazole) compound synthesized in Example <1-7>(223 mg, 1.07 mmol), 5,5'-bis(trimethylstannyl)-2,2'-bithiophene (52.6 mg, 1.07 mmol), Pd2(dba)3 (2 mg, 0.0021 mmol), P(o-tolyl)3 (3.5 mg, 0.0087 mmol), and 0.25 ml of chlorobenzene were loaded in a microwave-dedicated glass beaker, followed by reaction at 160° C. for 3 hours using a microwave device. Upon completion of the reaction, the reactant was precipitated by using methanol. Impurities and oligomers were removed by Soxhlet extraction using hexene and methanol. The polymer was extracted by using chloroform. As a result, 141 mg of the target compound was obtained as a dark blue solid (yield: 61.6%).

The final polymer synthesized by the process above according to the present invention is referred as 'RR-PfBT4T-OD'.

Example 2: Synthesis of PfBT4fT-OD Polymer

<2-1> Synthesis of 2-bromo-3-(2-octyldodecyl)thiophene

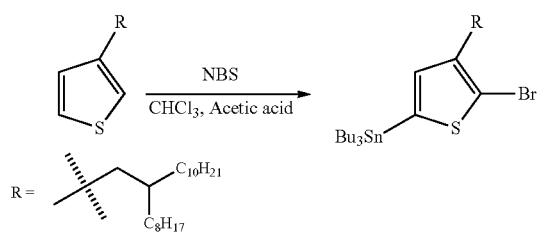

3-(2-Octyldodecyl)thiophene (4.00 g, 10.97 mmol), NBS (N-bromosuccinimide, 2.14 g, 12.06 mmol), chloroform (25 ml), and acetic acid (25 ml) were added in a 100 ml flask equipped with a nitrogen purge tube, followed by reaction at room temperature for one day. The reactant was extracted with distilled water and MC (methylene chloride). Then, moisture in the organic layer was dried over anhydrous sodium sulfate. The solid impurities were removed by filtration under reduced pressure. The remaining solvent was eliminated by evaporation, and the residue was separated by column chromatography (hexane). As a result, 4.51 g of the target compound was obtained as clear transparent oil (yield: 92.6%).

$^1$H NMR (400 MHz, CDCl3) δ (ppm): 7.11 (d, 1H), 6.74 (d, 2H), 2.48 (d, 2H), 1.25 (m, 33H), 0.88 (m, 6H).

<2-2> Synthesis of 3'',4'-difluoro-3,3'''-bis(2-octyldodecyl)-2,2':5',2'':5'',2'''-quaterthiophene

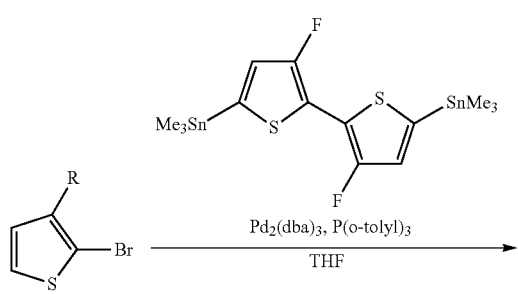

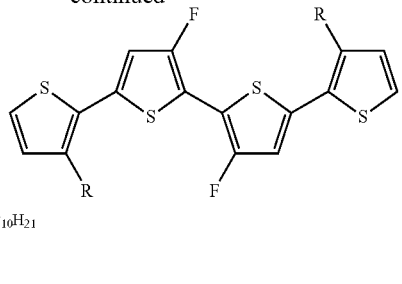

2-Bromo-3-(2-octyldodecyl)thiophene (2.51 g, 5.66 mmol) synthesized in Example <2-1> was mixed with (3,3'-difluoro-[2,2'-bithiophene]-5,5'-diyl)bis(trimethylstannane) (1.36 g, 2.57 mmol), Pd2(dba)3 (0.051 g, 0.055 mmol), P(o-tolyl)3 (0.062 g, 0.20 mmol), and THF (tetrahydrofuran, 20 ml) in a 100 ml flask equipped with a reflux condenser, followed by reflux stirring in an oil bath at 70° C. The reactant was cooled down at room temperature, followed by extraction several times with diethyl ether. Then, moisture in the organic layer was dried over anhydrous sodium sulfate. The solid impurities were removed by filtration under reduced pressure. The remaining solvent was eliminated by evaporation, and the residue was separated by column chromatography (hexane). As a result, 1.33 g of the target compound was obtained as transparent yellow oil (yield: 55.6%).

1H NMR (400 MHz, CDCl3) δ (ppm): 7.21 (d, 2H), 6.91 (d, 2H), 6.87 (s, 2H), 2.71 (d, 4H), 1.68 (m, 2H), 1.23 (m, 64H), 0.88 (m, 12H).

<2-3> Synthesis of (3'',4'-difluoro-3,3'''-bis(2-octyldodecyl)-[2,2':5',2'':5'',2'''-quaterthiophene]-5,5'''-diyl)bis(trimethylstannane)

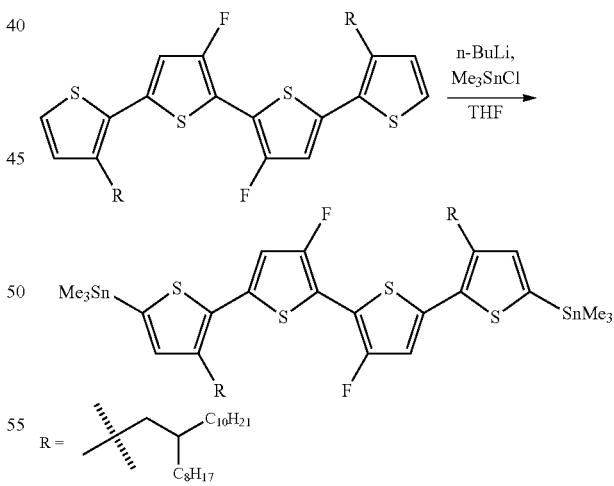

After eliminating moisture through frame dry, 3'',4'-difluoro-3,3'''-bis(2-octyldodecyl)-2,2':5',2'':5'',2'''-quaterthiophene (1.33 g, 1.43 mmol) synthesized in Example <2-2> and 15 ml of anhydrous THF (tetrahydrofuran) were loaded in a 100 ml flask equipped with a nitrogen purge tube, whose temperature was adjusted to be −78° C. with acetone and dry ice. 2.5 M n-BuLi (3.29 mmol, 1.32 ml) was slowly added thereto little by little, followed by reaction at −78° C. for 30 minutes. Then, the reaction was induced again at room temperature for 30 minutes. The temperature was dropped down again to −78° C., to which 1 M trimethyltin chloride (3.29 mmol, 3.29 ml) was added, followed by reaction at room temperature for one day. Extraction was performed by using distilled water and diethyl ether. Then, moisture in the organic layer was dried over anhydrous sodium sulfate. The solid impurities were removed by filtration under reduced pressure. The remaining solvent was eliminated by evaporation. As a result, the target compound was obtained as transparent brown oil (1.10 g, yield: 61.3%).

1H NMR (400 MHz, CDCl3) δ(ppm): 6.95 (s, 2H), 6.85 (s, 2H) 2.71 (d, 2H), 2.72 (d, 4H), 1.68 (m, 2H), 1.23 (m, 64H), 0.88 (m, 12H).

<2-4> Synthesis of tributyl(4-(2-octyldodecyl)thiophene-2-yl)stannane

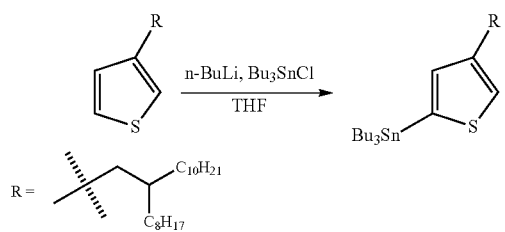

After eliminating moisture through frame dry, 3-(2-octyldodecyl)thiophene (2.00 g, 5.48 mmol) and 15 ml of anhydrous THF (tetrahydrofuran) were loaded in a 100 ml flask equipped with a nitrogen purge tube, whose temperature was adjusted to be −78° C. with acetone and dry ice. 2.5 M n-BuLi (13.7 mmol, 5.48 ml) was slowly added thereto little by little, followed by reaction at −78° C. for 30 minutes. Then, the reaction was induced again at room temperature for 30 minutes. The temperature was dropped down again to −78° C., to which tributyltin chloride (13.7 mmol, 4.45 g) was added, followed by reaction at room temperature for one day. Extraction was performed by using distilled water and diethyl ether. Then, moisture in the organic layer was dried over anhydrous sodium sulfate. The solid impurities were removed by filtration under reduced pressure. The remaining solvent was eliminated by evaporation. As a result, the target compound was obtained as transparent brown oil (3.14 g, yield: 87.7%). The reaction was carried out without any purification process.

<2-5> Synthesis of 4-bromo-5-fluoro-7-(4-(2-octyldodecyl)thiophene-2-yl)benzo[c][1,2,5]thiadiazole

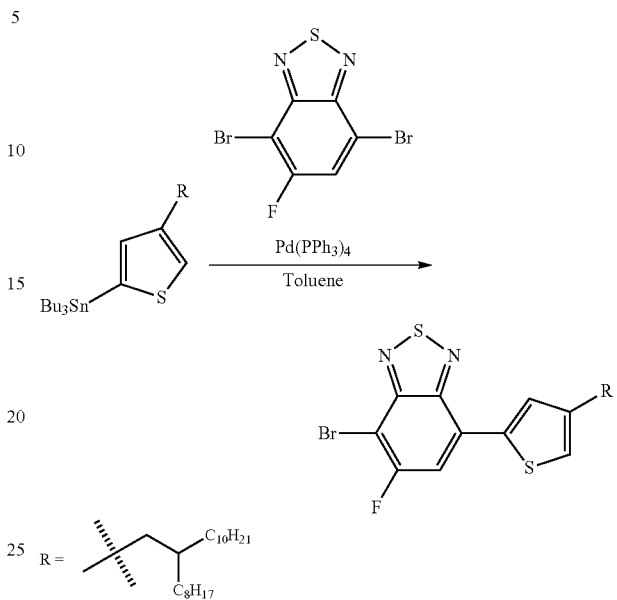

Tributyl(4-(2-octyldodecyl)thiophen-2-yl)stannane (3.14 g, 4.80 mmol) synthesized in Example <2-4> was mixed with 4,7-dibromo-5-fluorobenzo[c][1,2,5]thiadiazole (1.72 g, 5.52 mmol), Pd(PPh3)4 (0.27 g, 0.23 mmol), and toluene (15 ml) in a 100 ml flask equipped with a reflux condenser, followed by reflux stirring in an oil bath for 16 hours. The reactant was cooled down at room temperature, followed by extraction several times with MC. Then, moisture in the organic layer was dried over anhydrous sodium sulfate. The solid impurities were removed by filtration under reduced pressure. The remaining solvent was eliminated by evaporation, and the residue was separated by column chromatography (hexane). As a result, 1.66 g of the target compound was obtained as transparent yellow oil (yield: 58.5%).

1H NMR (400 MHz, CDCl3) δ (ppm): 7.97 (s, 1H), 7.70 (d, 1H), 7.11 (s, 1H), 2.64 (d, 2H), 1.71 (m, 1H), 1.30 (m, 32H), 0.89 (m, 6H)

<2-6> Synthesis of 7,7'-(3'',4'-difluoro-3,3'''-bis(2-octyldodecyl)-[2,2':5',2'':5'',2'''-quaterthiophene]-5,5'''-diyl)bis(6-fluoro-4-(4-(2-octyldodecyl)thiophene-2-yl)benzo[c][1,2,5]thiadiazole)

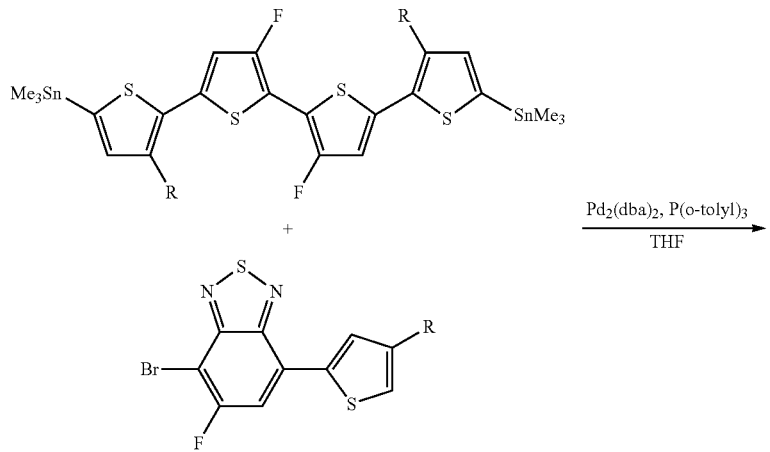

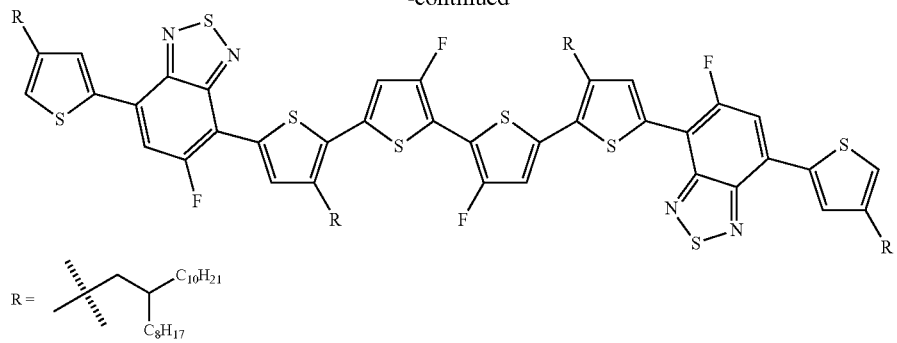

(3",4'-difluoro-3,3'''-bis(2-octyldodecyl)-[2,2':5',2":5", 2'''-quaterthiophene]-5,5'''-diyl)bis(trimethylstannane) (1.10 g, 0.88 mmol) synthesized in Example <2-3>, 4-Bromo-5-fluoro-7-(4-(2-octyldodecyl)thiophen-2-yl) benzo[c][1,2,5]thiadiazole (1.20 g, 2.02 mmol) synthesized in Example <2-5>, Pd2(dba)3 (0.016 mmol, 0.017 mmol), P(o-tolyl)3 (0.07 mmol, 0.021 g), and 15 ml of THF (tetrahydrofuran) were added in a 100 ml flask equipped with a reflux condenser, followed by reflux stirring in an oil bath for 16 hours. The reactant was cooled down at room temperature, followed by extraction several times with distilled water and MC (methylene chloride). Then, moisture in the organic layer was dried over anhydrous sodium sulfate. The solid impurities were removed by filtration under reduced pressure. The remaining solvent was eliminated by evaporation, and the residue was separated by column chromatography (MC:HEX=1:20). As a result, 0.61 g of the target compound was obtained as a red solid (yield: 35.4%).

1H NMR (400 MHz, CDCl3) δ(ppm): 8.07 (s, 2H), 7.93 (s, 2H), 7.77 (d, 2H), 7.05 (s, 2H), 7.01 (s, 2H), 2.82 (d, 4H), 2.61 (d, 4H), 1.83 (m, 2H), 1.69 (m, 2H), 1.25 (m, 128H), 0.86 (m, 24H)

<2-7> Synthesis of 7,7'-(3",4'-difluoro-3,3'''-bis(2-octyldodecyl)-[2,2':5',2":5",2'''-quarter thiophene]-5, 5'''-diyl)bis(4-(5-bromo-4-(2-octyldodecyl)thiophene-2-yl)-6-fluorobenzo[c][1,2,5]thiadiazole)

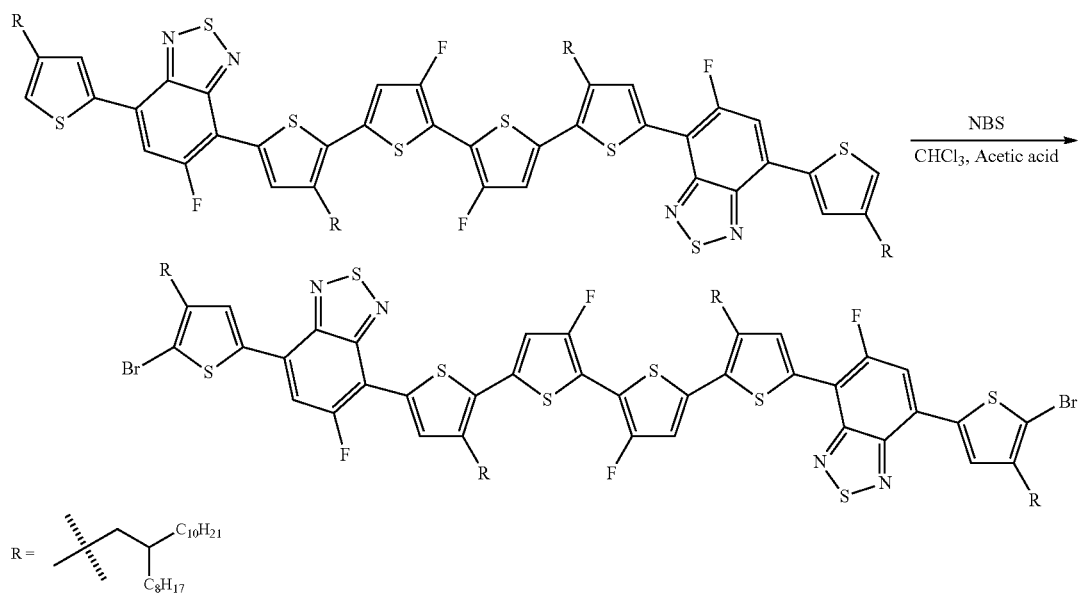

7,7'-(3",4'-difluoro-3,3'''-bis(2-octyldodecyl)-[2,2':5',2": 5",2'''-quaterthiophene]-5,5'''-diyl)bis(6-fluoro-4-(4-(2-octyldodecyl)thiophen-2-yl)benzo[c][1,2,5]thiadiazole) (0.61 g, 0.31 mmol) synthesized in Example <2-6>, NBS (N-bromosuccinimide) (0.12 g, 0.68 mmol), 10 ml of chloroform, and 10 ml of acetic acid were added in a 100 ml flask equipped with a nitrogen purge tube, followed by reaction at room temperature. Extraction was performed several times by using distilled water and MC (methylene chloride). Then, moisture in the organic layer was dried over anhydrous sodium sulfate. The solid impurities were removed by filtration under reduced pressure. The remaining solvent was eliminated by evaporation, and the residue was separated by column chromatography (MC:HEX=1:25). As a result, 0.51 g of the target compound was obtained as a purple solid (yield: 77.7%).

1H NMR (400 MHz, CDCl3) δ(ppm): 8.06 (s, 2H), 7.69 (s, 2H), 7.60 (d, 2H), 7.00 (s, 2H), 2.81 (d, 4H), 2.54 (d, 4H), 1.83 (m, 2H), 1.75 (m, 2H), 1.24 (m, 128H), 0.86 (m, 24H)

<2-8> Synthesis of RR PfBTff4T-OD

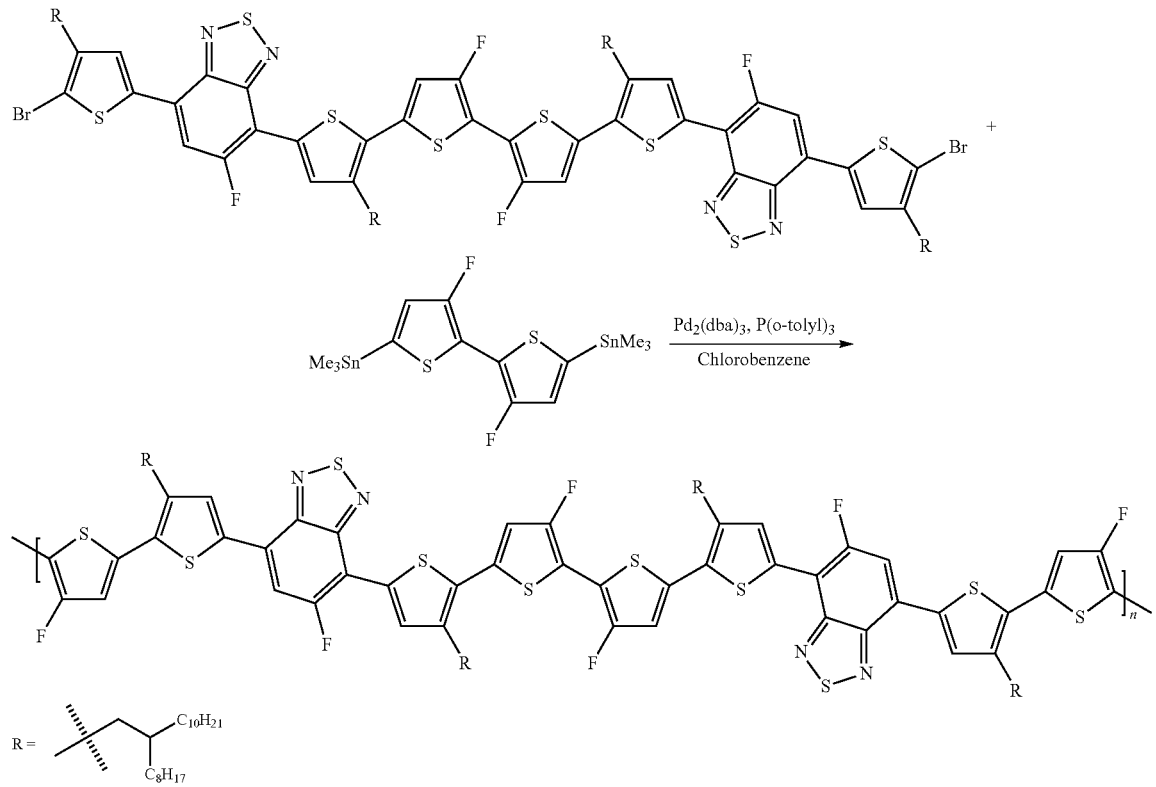

7,7'-(3",4'-difluoro-3,3'"-bis(2-octyldodecyl)-[2,2':5',2": 5",2'"-quaterthiophene]-5,5'"-diyl)bis(4-(5-bromo-4-(2-octyldodecyl)thiophen-2-yl)-6-fluorobenzo[c][1,2,5]thiadiazole) (204 mg, 0.096 mmol) synthesized in Example <2-7>, (3,3'-difluoro-[2,2'-bithiophene]-5,5'-diyl)bis(trimethylstannane) (50 mg, 0.096 mmol), Pd2(dba)3 (2 mg, 0.002 mmol), P(o-tolyl)3 (2.4 mg, 0.008 mmol), and 0.25 ml of chlorobenzene were loaded in a microwave-dedicated glass beaker, followed by reaction at 160° C. for 3 hours using a microwave device. Upon completion of the reaction, the reactant was precipitated by using methanol. Impurities and oligomers were removed by Soxhlet extraction using hexene and methanol. The polymer was extracted by using chloroform. As a result, 151 mg of the target compound was obtained as a dark blue solid (yield: 71.9%).

The final polymer synthesized by the process above according to the present invention is referred as 'RR PfBTff4T-OD'.

Example 3: Construction of an Organic Photovoltaic Cell Comprising RR-PfBT4T-OD, the Polymer Compound of the Invention A solar cell was constructed by using RR-PfBT4T-OD, the conductive polymer prepared in Example 1 according to the present invention, as follows.

The glass substrate coated with ITO was washed by ultrasonic cleaning with acetone, distilled water, and isopropyl alcohol in that order for 10 minutes each, followed by drying. The dried ITO substrate was placed in an UV ozone chamber and treated therein for 20 minutes. The substrate was coated with ZnO by sol-gel method, followed by heat-treatment at 200° C. for 1 hour. The heat-treated substrate was cooled fully. The substrate was coated via spin coating (800 rpm) with a mixed solution prepared by mixing 0.4 ml of a mixture of chlorobenzene and 1,8-diiodooctane (97:3) and a mixture of PfBT4T-OD, the polymer obtained in Example 1 (3.2 mg), and (6,6)-phenyl-C71-butylic acid methyl ester (PC71BM) (4.8 mg) (1:1.5). Then, 10 nm of moly oxide ($MoO_3$) and silver (Ag) electrode were deposited thereon at the thickness of 100 nm. As a result, a solar cell having the structure of ITO/ZnO/PfBT4T-OD:PC71BM (1:1.5)/MoO3/Ag was obtained.

Example 4: Construction of an Organic Photovoltaic Cell Comprising RR PfBTff4T-OD, the Polymer Compound of the Invention A solar cell was constructed by using RR PfBTff4T-OD, the conductive polymer prepared in Example 2 according to the present invention, as follows.

The glass substrate coated with ITO was washed by ultrasonic cleaning with acetone, distilled water, and isopropyl alcohol in that order for 10 minutes each, followed by drying. The dried ITO substrate was placed in an UV ozone chamber and treated therein for 20 minutes. The substrate was coated with ZnO by sol-gel method, followed by heat-treatment at 200° C. for 1 hour. The heat-treated substrate was cooled fully. The substrate was coated via spin coating (800 rpm) with a mixed solution prepared by mixing 0.4 ml of a mixture of xylene and diphenyl ether (97:3) and a mixture of RR PfBTff4T-OD, the polymer obtained in Example 2 (2.4 mg), and (6,6)-phenyl-C71-butylic acid methyl ester (PC71BM) (4.8 mg) (1:1.5). Then, 10 nm of moly oxide ($MoO_3$) and silver (Ag) electrode were deposited thereon at the thickness of 100 nm. As a result, a solar cell having the structure of ITO/ZnO/PfBTff4T-OD:PC71BM(1:1.5)/MoO3/Ag was obtained.

Experimental Example 1: Measurement of Optical Band Gap of the Polymer Compound of the Invention <1-1> Measurement of Optical Band Gap of the Conductive Polymer RR-PfBT4T-OD The following experiment was performed to measure the optical band gap of the conductive polymer of the present invention.

Absorbance was measured using a spectrophotometer (UV-vis spectrometer). Absorbance in the liquid phase was measured in chloroform solution and absorbance in the solid phase (film) was measured after the polymer dissolved in chloroform was coated on the glass substrate by spin coating. Each graph was normalized and plotted As shown in FIG. 1, the polymer compound RR-PfBT4T-OD of the present invention demonstrated the maximum absorption at 580 nm in the chloroform solvent, while it displayed the maximum absorption on the solid film at 640~720 nm. The optical band gap of the conductive polymer of Example 1 of the invention was 1.58 eV on the film and 1.62 eV in the solution, suggesting that the optical band gap of the conductive polymer according to the present invention was reduced on the film by inter-polymer chain packing.

TABLE 1

Optical properties of RR-PfBT4T-OD

| $E_g$ on film (eV) | $E_g$ in solution (eV) |
|---|---|
| 1.58 | 1.62 |

<1-2> Measurement of optical Band Gap of the Conductive Polymer RR PfBTff4T-OD

The following experiment was performed by the same manner as described in Experimental Example <1-1>.

Figure 2:
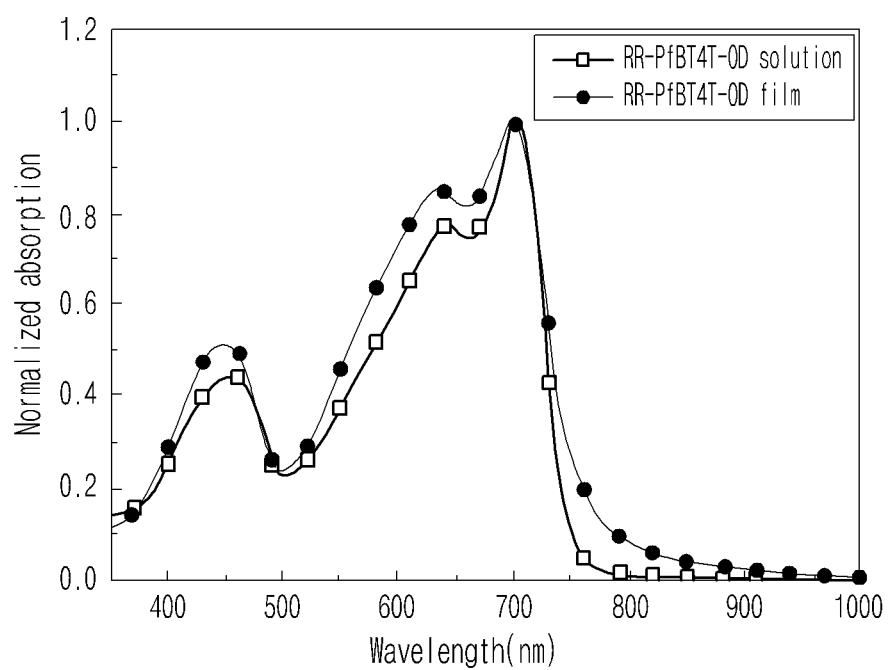
FIG. 2 presents the UV-vis absorption spectra of the polymer compound of the invention (RR-PfBTff4T-OD) in solution and on film.

As shown in FIG. 2, the polymer compound RR PfBTff4T-OD of the present invention showed the maximum absorption at 700 nm in the chloroform solvent and on the film. The optical band gap of the conductive polymer of Example 2 of the invention was 1.59 eV on the film and 1.64 eV in the solution, suggesting that the optical band gap of the conductive polymer according to the present invention was reduced on the film by inter-polymer chain packing.

TABLE 2

Optical properties of RR-PfBTff4T-OD

| $E_g$ on film (eV) | $E_g$ in solution (eV) |
|---|---|
| 1.59 | 1.64 |

Experimental Example 2: Evaluation of Electrochemical Characteristics of the Polymer Compound of the Present Invention <2-1> Evaluation of Electrochemical Characteristics of the Conductive Polymer Compound RR-PfBT4T-OD Cyclic voltammetry was performed to evaluate the electrochemical characteristics of the conductive polymer of the present invention.

Silver and silver univalent cations were used as the standard electrode. Glassy carbon was used as the working electrode and Pt wire was used as the counter electrode. Cyclic voltammetry was measured using ferrocene as the standard. The measurement was achieved by making the ferrocene as the standard. At this time, 0.1 M tetrabutyl ammonium hexafluorophosphate was used as the electrolyte for the sample.

Figure 3:
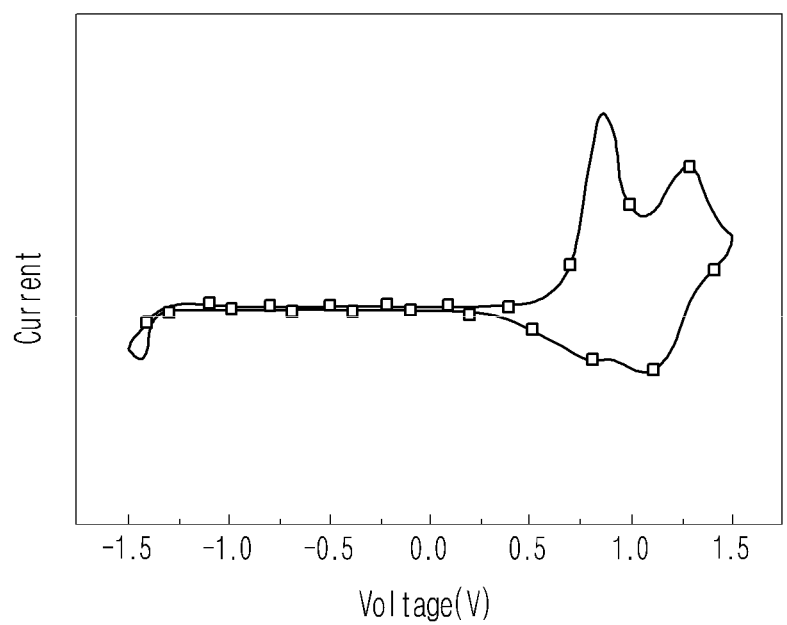
FIG. 3 presents the cyclic voltammetry of the polymer of the invention (RR PfBT4T-OD).

As a result, as shown in FIG. 3 and Table 3, HOMO and LUMO energy values of the compound were calculated as 5.45 eV and −3.68 eV respectively and the band gap was 1.77 eV.

TABLE 3

Electrochemical characteristics of RR-PfBT4T-OD

| $E_{ox}$ (V) | $E_{ox}$ (V) | HOMO (eV) | LUMO (eV) | $Eg^{CV}$ (eV) |
|---|---|---|---|---|
| 1.07 | −0.70 | −5.45 | −3.68 | 1.77 |

<2-2> Evaluation of Electrochemical Characteristics of the Conductive Polymer Compound RR-PfBTff4T-OD The following experiment was performed by the same manner as described in Experimental Example <2-1>.

Figure 4:
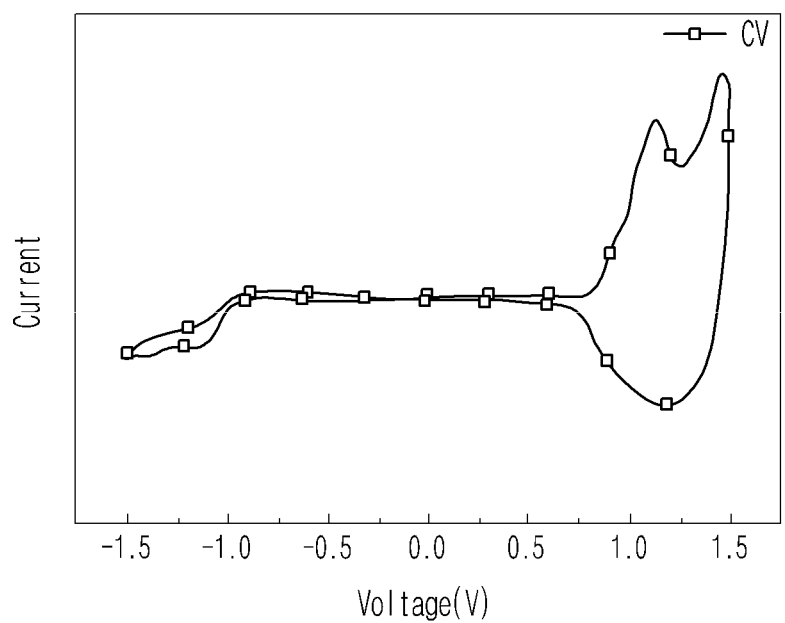
FIG. 4 presents the cyclic voltammetry of the polymer of the invention (RR-PfBTff4T-OD).

As a result, as shown in FIG. 4 and Table 4, HOMO and LUMO energy values of the compound were calculated as 5.23 eV and 3.32 eV respectively and the band gap was 1.91 eV.

TABLE 4

Electrochemical characteristics of RR-PfBTff4T-OD

| E(V) | $E_{ox}$(V) | HOMO (eV) | LUMO (eV) | $Eg^{CV}$ (eV) |
|---|---|---|---|---|
| 0.85 | −1.08 | 5.23 | 3.32 | 1.91 |

Experimental Example 3: Evaluation of the Characteristics of the Organic Photovoltaic Cell Comprising the Polymer of the Present Invention The following experiment was performed to investigate the characteristics of the organic photovoltaic cell comprising the conductive polymer of the present invention.

Particularly among the electrochemical properties, fill factor and energy conversion efficiency of each organic photovoltaic cell prepared in Example 3 and Example 4 were calculated by mathematical formula 1 and mathematical formula 2 below.

Figure 5:
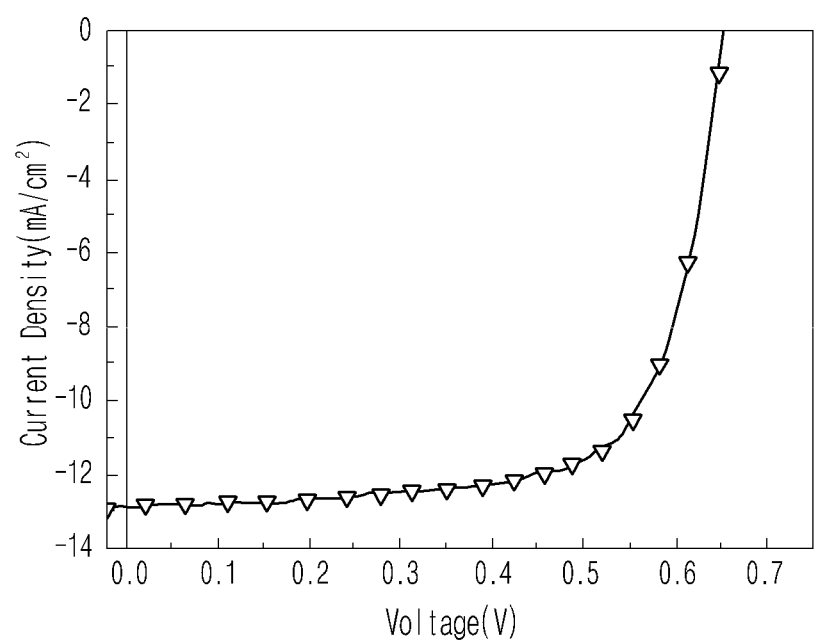
FIG. 5 is a graph illustrating the current density-voltage curve of the organic photovoltaic cell comprising the polymer compound of the invention (RR PfBT4T-OD).
Figure 6:
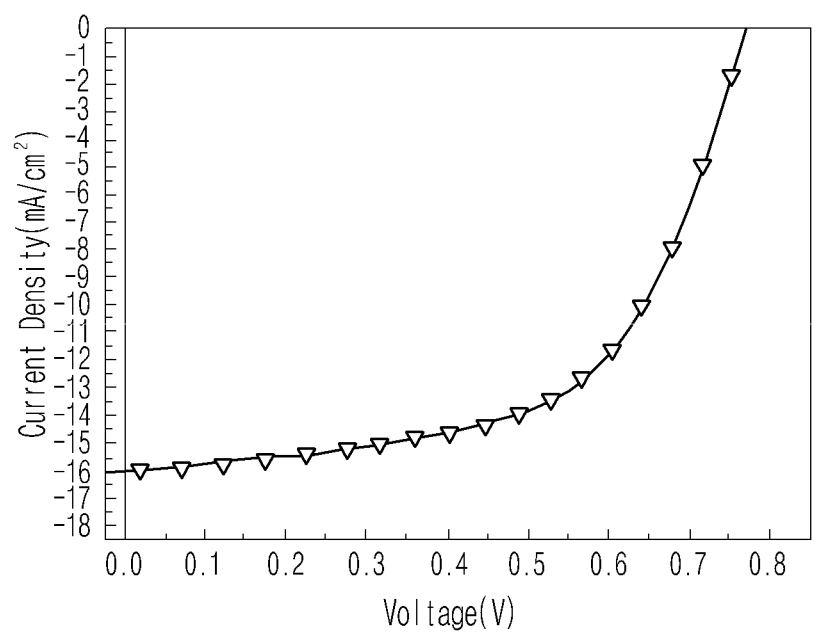
FIG. 6 is a graph illustrating the current density-voltage curve of the organic photovoltaic cell comprising the polymer compound of the invention (RR-PfBTff4T-OD).

The results of the organic photovoltaic cell device (ITO/ZnO/PfBTff4T-OD:PC71BM(1:1.5)/MoO3/Ag) prepared in Example 3 are shown in Table 5 and FIG. 5. The results of the organic photovoltaic cell device (ITO/ZnO/PfBTff4TOD:PC71BM(1:1.5)/MoO3/Ag) prepared in Example 4 are shown in Table 6 and FIG. 6.

Fill factor (FF)=(*V*mp×*I*mp)/(*V*oc×*I*sc)    [Mathematical Formula 1]

Wherein, $V_{mp}$ indicates the voltage value at the maximum power point, and $I_{mp}$ indicates the current value at the maximum power point. $V_{oc}$ is the photo open voltage and $I_{sc}$ is the photo short circuit current.

Energy conversion efficiency (PCE,%)=feel factor× [(*J*sc×*V*oc)/100]    [Mathematical Formula 2]

Wherein, $J_{sc}$ is the photo short circuit current density and Voc is the photo open voltage.

TABLE 5

Characteristics of the RR PfBT4T-OD polymer based organic photovoltaic cell

| RR PfBT4T-OD:PC$_{71}$BM | $V_{oc}$ (V) | $J_{sc}$ (mA/cm$^2$) | FF (%) | PCE (%) |
|---|---|---|---|---|
| 1:1.6 | 0.65 | 12.89 | 69.59 | 5.85 |

As shown in Table 5, $V_{oc}$ of the organic photovoltaic cell of the invention was 0.65 and $J_{sc}$ was 12.89, while fill factor was 69.59%. From the result of the current density-voltage measurement, the energy conversion rate of the polymer of the invention was as excellent as 5.85%.

TABLE 6

Characteristics of the RR PfBTff4T-OD polymer based organic photovoltaic cell

| 농도 | 비율 | $V_{oc}$ (V) | $J_{sc}$ (mA/cm$^2$) | FF (%) | PCE (%) |
|---|---|---|---|---|---|
| 15 mg/ml | 1:1.5 | 0.77 | 16.04 | 58.12 | 7.16 |

As shown in Table 6, $V_{oc}$ of the organic photovoltaic cell of the invention was 0.67 and $J_{sc}$ was 16.04, while fill factor was 58.12%. From the result of the current density-voltage measurement, the energy conversion rate of the polymer of the invention was as excellent as 7.16%.

The results above indicate that the conductive polymer compound of the present invention is suitable as a polymer for the organic photovoltaic cell which is particularly excellent in photon absorptiveness and hole mobility.

As explained hereinbefore, the conductive polymer of the present invention not only is useful as a low band gap electron donor for an organic photovoltaic cell but also displays improved high photon absorptiveness, so that it can be used as a material for an organic optoelectronic device applicable to various fields of OPD, OTFT, OLED, and organic photovoltaic cells. In particular, the conductive polymer can be effectively used for the organic photovoltaic cell with improved energy conversion efficiency.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended Claims.

BRIEF DESCRIPTION OF THE MARK OF DRAWINGS

HOMO: highest occupied molecular orbital
LUMO: lowest unoccupied molecular orbital
Band gap: space between HOMO and LUMO
Voc: voltage at both ends of the photovoltaic system as not being loaded (open) at a specific temperature and sunlight intensity.
Jsc: output current of the photovoltaic system such as solar cell or module in the short circuit conditions at a specific temperature and sunlight intensity. In some case, the short circuit current per unit area is called Jsc.
FF: ratio of the maximum output to open-circuit voltage X short-circuit current, which is an index indicating the quality of the current-voltage characteristic curve (I-V curve). FF depends on the internal series, parallel resistance and diode quality factor.
PCE: result of the multiplication of the area (solar cell area A) generating the maximum power (Pmax) of the solar cell by the incidence irradiance (E) measured under the prescribed test conditions, which is presented as percentage (%).

What is claimed is:

1. A method for preparing the polymer represented by formula 1, which comprises the following steps:
   (a) producing the compound represented by formula 2 having a symmetrical structure by reacting a quaterthiophene derivative and a benzothiadiazole derivative with the substitution of bromine and fluorine in the presence of a palladium catalyst;
   (b) producing the compound represented by formula 3 by reacting the compound represented by formula 2 with a brominating agent; and
   (c) reacting the compound represented by formula 3 with a bithiophene derivative in the presence of a palladium catalyst:

[Formula 1]

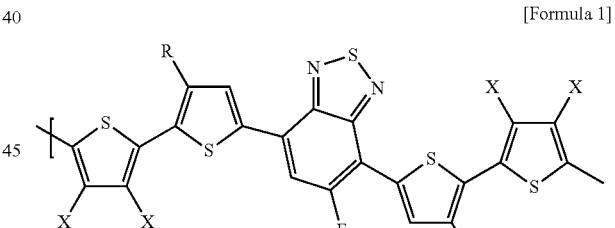

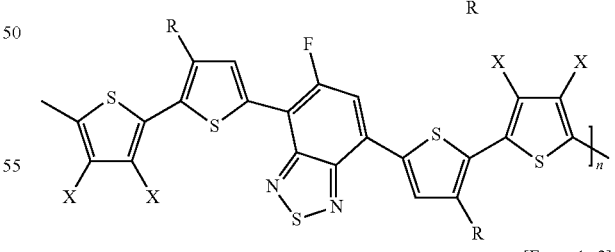

[Formula 2]

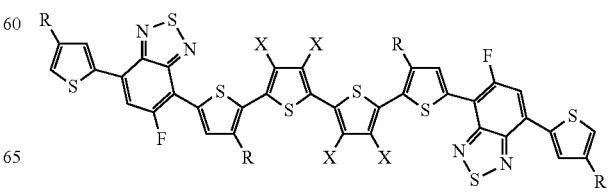

-continued

[Formula 3]

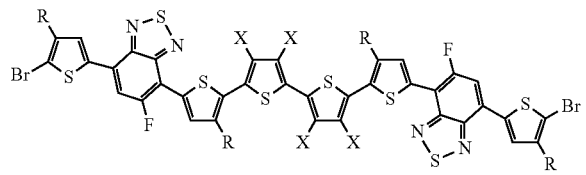

wherein R is independently $C_1$~$C_{30}$ straight or branched alkyl, $C_1$~$C_{30}$ straight or branched alkoxy, or $C_6$~$C_{30}$ aryl, wherein the alkyl, alkoxy, and aryl can be substituted with one or more $C_1$~$C_{10}$ alkyl, hydroxyl, amino, or carboxy, and the alkyl, alkoxy, and aryl can independently contain one or more hetero atoms, X is independently H or F, N is an integer of 1~500.

2. The method for preparing the polymer represented by formula 1 according to claim 1, wherein the R in the formulas above is independently selected from the group consisting of ethylhexyl, butyloctyl, hexyldecyl, and octyldodecyl.

3. The method for preparing the polymer represented by formula 1 according to claim 1, wherein the palladium catalyst is selected from the group consisting of PdCl2, Pd(OAc)2, Pd(CH3CN)2Cl2, Pd(PhCN)2Cl2, Pd2(dba)3, and Pd(PPh3)4.

4. The method for preparing the polymer represented by formula 1 according to claim 1, wherein the quaterthiophene derivative is (3,3'''-bis(2-octyldodecyl)-[2,2':5',2'':5'',2'''-quaterthiophene]-5,5'''-yl)bis(trimethylstannane) or (3'',4'-difluoro-3,3'''-bis(2-octyldodecyl)-[2,2':5',2'': 5'',2'''-quaterthiophene]-5,5'''-diyl)bis(trimethylstannane).

5. The method for preparing the polymer represented by formula 1 according to claim 1, wherein the benzothiadiazole derivative with the substitution of bromine and fluorine is 4-bromo-5-fluoro-7-(4-(2-octyldodecyl)thiophene-2-yl)benzo[c][1,2,5]thiadiazole.

6. The method for preparing the polymer represented by formula 1 according to claim 1, wherein the bithiophene derivative is 5,5'-bis(trimethylstannyl)-2,2'-bithiophene or (3,3'-difluoro-[2,2'-bithiophene]-5,5'-diyl)bis(trimethyl stannane).

* * * * *